United States Patent
Kawai et al.

(10) Patent No.: US 6,410,991 B1
(45) Date of Patent: Jun. 25, 2002

(54) SEMICONDUCTOR DEVICE AND METHOD OF MANUFACTURING THE SAME

(75) Inventors: Kenji Kawai; Kazumasa Yonekura, both of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/196,107

(22) Filed: Nov. 20, 1998

(30) Foreign Application Priority Data

Jun. 15, 1998 (JP) .......................................... 10-167160

(51) Int. Cl.[7] .................. H01L 29/76; H01L 29/167; H01L 21/265; H01L 21/425; H01L 21/76
(52) U.S. Cl. .................. 257/914; 257/392; 257/607; 438/520; 438/528; 438/423
(58) Field of Search .................. 257/392, 607, 257/914; 438/520, 528, 423

(56) References Cited

U.S. PATENT DOCUMENTS

| | | | |
|---|---|---|---|
| 4,748,134 A | * | 5/1988 | Holland et al. ................ 437/62 |
| 5,330,920 A | * | 7/1994 | Soleimani et al. ............. 437/24 |
| 5,371,026 A | | 12/1994 | Hayden et al. |
| 5,576,226 A | | 11/1996 | Hwang |
| 5,963,839 A | * | 10/1999 | Huang .......................... 438/766 |
| 6,033,998 A | * | 3/2000 | Aronowitz ..................... 438/786 |

FOREIGN PATENT DOCUMENTS

| | | |
|---|---|---|
| EP | 0244367 A2 * | 4/1987 |
| EP | 0 244 367 A2 | 11/1987 |
| EP | 0 713 249 A1 | 5/1996 |
| JP | 63-205944 | 8/1988 |
| JP | 7-297298 | 11/1995 |
| JP | 9-92729 | 4/1997 |

OTHER PUBLICATIONS

Gerold Neudeck, "Introduction to Microelectronic Fabrication", 1988 Addison–Wesley Publishing, pp. 101–102).*
Jaeger,Richard, "Introduction to Microelectronic Fabrication", 1988 Addison–Wesley Publishing, pp. 101–102).*
Doyle, Brian, "Simultaneous Growth to Different Thickness Gate Oxides in Silicon CMOS Processing", 1995 IEEE.*
Liu, C.T, "Light Nitrogen Implant for Preparing Thin– Gate Oxides", 1997 IEEE.*

* cited by examiner

Primary Examiner—Carl Whitehead, Jr.
Assistant Examiner—James Mitchell
(74) Attorney, Agent, or Firm—McDermott, Will & Emery

(57) ABSTRACT

A relatively thick gate oxide film and a relatively thin gate oxide film are formed on a surface of silicon substrate. In a region exactly under the relatively thick gate oxide film, a halogen is added only within a depth range of no more than 2 nm from the main surface of silicon substrate. Thus, a semiconductor device having a dual gate oxide and a method of manufacturing the same can be obtained capable of reducing damage to the substrate through a simplified process.

5 Claims, 23 Drawing Sheets

SEMICONDUCTOR DEVICE AND METHOD OF MANUFACTURING THE SAME

BACKGROUND OF THE INVENTION

1. Field of the Invention

The present invention relates to semiconductor devices and methods of manufacturing the same, and in particular to a semiconductor device wherein one device has a plurality of gate oxide films with different film thicknesses, and a method of manufacturing the same.

2. Description of the Background Art

In recent years, with integration of semiconductor devices, a device (dual gate oxide device) having gate oxide films with different thicknesses in one chip has been increasingly used. The dual gate oxide device has been significantly increasingly used particularly for a device in which a memory device including a dynamic random access memory (DRAM) and a logic device are mounted in a mixed manner.

A method of manufacturing a semiconductor device having a conventional dual gate oxide will now be described.

FIGS. 57–62 are schematic cross sectional views illustrating steps of a method of manufacturing a semiconductor device having a conventional dual gate oxide. Referring first to FIG. 57, a field oxide film 2 is formed at a surface of a silicon substrate 1 and thermal oxidation is then applied.

Referring to FIG. 58, the thermal oxidation allows a first gate oxide film 6a to be formed on a surface of silicon substrate 1. A normal photolithography technique is employed to form a resist pattern 61a on a predetermined region. The first gate oxide film 6a that is not covered by resist pattern 61a is removed through e.g. wet-etching.

Referring to FIG. 59, the wet-etching causes a surface of silicon substrate 1 to be exposed at the portion from which silicon oxide film 6a is removed. After resist pattern 61a is removed, thermal oxidation is again applied.

Referring to FIG. 60, the thermal oxidation allows a second gate oxide film 6b to be formed on an exposed surface of silicon substrate 1 and the first gate oxide film 6a to be increased in thickness. Thus the film thickness of the first gate oxide film 6a is greater than that of the second gate oxide film 6b to form a dual gate oxide.

Referring to FIG. 61, a conductive layer 7 for a gate is formed on the entire surface. A normal photolithography technique is employed to form a resist pattern 61b on a predetermined region of conductive layer 7 for a gate. Resist pattern 61b is used as a mask to etch conductive layer 7. Then resist pattern 61b is removed.

Referring to FIG. 62, this etching allows conductive layer 7 for a gate to be patterned to form a gate electrode layer 7. Gate electrode layer 7, field oxide film 2 and the like are used as a mask for injection of an impurity to form source/drain region 8a, 8b at a surface of silicon substrate 1. Thus a metal oxide semiconductor (MOS) transistor having relatively thick gate oxide film 6a and a MOS transistor having relatively thin gate oxide film 6b are obtained.

While the method described above allows formation of dual gate oxide, it requires different thermal oxidation steps for forming gate oxide films having different thicknesses and this results in a cumbersome manufacturing process. Methods of formation of dual gate oxide in a simpler process have been disclosed in e.g. Japanese Patent Laying-Open Nos. 7-297298, 9-92729 and 63-205944. A method disclosed in Japanese Patent Laying-Open No. 7-297298 will now be exemplarily described.

FIGS. 63–65 are schematic cross sectional views illustrating steps of the method of manufacturing a semiconductor device having a dual gate oxide that is disclosed in Japanese Patent Laying-Open No. 7-297298. Referring first to FIG. 63, a field oxide film 2 is formed at a surface of a silicon substrate 1.

Referring to FIG. 64, a normal photolithography technique is employed to form a resist pattern 71 on silicon substrate 1 at a predetermined region. An oxidation promoting substance, such as F or Cl, as a substance from the halogen group is ion-injected into a surface of silicon substrate 1 that is not covered by resist pattern 71. Then resist pattern 71 is removed.

Referring to FIG. 65, an oxidation step is provided to form a gate oxide film. In this oxidation step, the substance from the halogen group acts to promote oxidation. Thus gate oxide film 6a formed at a region which is ion-injected with an oxidation promoting substance is formed thicker than gate oxide film 6b formed at a region which is not ion-injected with the oxidation promoting substance. Thus a dual gate oxide is formed.

The method shown in FIGS. 63–65 allows dual gate oxide to be formed with one oxidation step and can thus simplify the process.

Japanese Patent Laying-Open No. 7-297298 also discloses a method of forming a dual gate oxide with one oxidation step by ion-implanting nitrogen (N) as an oxidation restraining substance rather than an oxidation promoting substance.

For this ion injection, it is difficult to draw ions with an acceleration energy of less than 1 keV. Thus, ion-injecting an oxide promoting substance or an oxide restraining substance requires an injection energy of at least 1 keV. However, if ions are injected with the injection energy of at least 1 keV, the oxidation promoting substance or oxidation restraining substance will be distributed to a location more than 2 nm deeper than the surface of silicon substrate.

According to the method described above, an oxidation promoting substance or an oxidation restraining substance is introduced into silicon substrate 1 through ion injection. The ion injection is a technique of physically injecting ions into silicon substrate 1 and the injection energy is relatively large. Thus, ion injection of an oxidation promoting substance and the like results in a large number of lattice defects at a surface of silicon substrate 1 and thus significantly damages the surface of silicon substrate 1. In order to repair the significant damage, a thermal process (annealing) step is additionally required and thus renders the manufacturing process cumbersome.

SUMMARY OF THE INVENTION

An object of the present invention is to provide a semiconductor device having a dual gate oxide with the substrate less damaged in a simplified process, and a method of manufacturing the same.

A semiconductor device according to the present invention includes a semiconductor substrate, first and second gate oxide films, and an oxidation rate adjusting substance. The semiconductor substrate has first and second regions. The first gate oxide film is formed in the first region such that the first gate oxide film is in contact with a main surface of the semiconductor substrate. The second gate oxide film is formed in the second region such that the second gate oxide film is in contact with a main surface of the semiconductor substrate. The second gate oxide film is different in thickness from the first gate oxide film. The oxidation rate adjusting substance is only added within a depth range of no more than 2 nm from the main surface of the semiconductor substrate in the first region.

The semiconductor device according to the present invention has an oxidation rate adjusting substance distributed only within a depth range of no more than 2 nm from a main surface of the semiconductor substrate, i.e. to a location shallower more than conventional. Thus the energy required in adding the oxidation rate adjusting substance can be greatly reduced as compared with that required for conventional ion injection. Thus a semiconductor device can be obtained which is less damaged by lattice defect and the like.

In the above semiconductor device, preferably the oxidation rate adjusting substance is an oxidation promoting substance and the first gate oxide film is greater in thickness than the second gate oxide film.

Thus, when gate oxidation is applied to the first and second regions, simultaneously the first region with the oxidation promoting substance added thereto can be greater in gate oxide film thickness than the second region without the oxidation promoting substance added thereto.

For the above semiconductor device, the oxidation promoting substance is preferably a halogen.

Thus the oxidation promoting effect of the halogen can be utilized.

For the above semiconductor substrate, preferably the oxidation rate adjusting substance is an oxidation restraining substance and the first gate oxide film is thinner than the second gate oxide film.

Thus, if gate oxidation is applied to the first and second regions simultaneously, the first region with the oxidation restraining substance added thereto can be greater in gate oxide film thickness than the second region without the oxidation restraining substance added thereto.

For the above semiconductor device, the oxidation restraining substance is preferably nitrogen.

Thus the oxidation restraining effect of nitrogen can be utilized.

A semiconductor device manufacturing method according to the present invention is a method of manufacturing a semiconductor device including gate oxide films each having a different thickness on first and second regions of the main surface of the semiconductor substrate and the semiconductor device manufacturing method according to the present invention includes the following steps:

Initially the first region of the main surface of the semiconductor substrate is exposed to a plasma of a gas containing an oxidation rate adjusting substance to add the oxidation rate adjusting substance to the first region of the main surface of the semiconductor substrate. Then the first and second regions of the main surface of the semiconductor substrate are simultaneously oxidized to form a first gate oxide film on the first region and a second gate oxide film on the second region free from addition of the oxidation rate adjusting substance, wherein the first gate oxide film is different in thickness from the second gate oxide film.

In the semiconductor device manufacturing method according to the present invention, exposure to plasma causes an oxidation rate adjusting substance to be added to the semiconductor substrate. According to the method of adding an oxidation rate adjusting substance, the energy required in adding it can be greatly reduced as compared with conventional ion injection, to reduce damage to the semiconductor substrate, such as lattice defect. Thus the damage can be readily repaired simply by e.g. the thermal oxidation for forming the gate oxide film. This can eliminate an additional thermal oxidation step for damage repair as conventional and thus simplify the process.

For the above semiconductor device manufacturing method, preferably the oxidation rate adjusting substance is an oxidation promoting substance and the first gate oxide film is thicker in film thickness than the second gate oxide film.

Thus, if gate oxidation is applied to the first and second regions simultaneously, the first region with the oxidation promoting substance added thereto can be greater in gate oxide film thickness than the second region without the oxidation promoting substance added thereto.

For the above semiconductor device manufacturing method, preferably the oxidation promoting substance is a halogen.

Thus the oxidation promoting effect of the halogen can be utilized.

For the above semiconductor device manufacturing method, a gas containing the oxidation rate adjusting substance is preferably a gas containing at least one selected from the group consisting of $NF_3$, $SF_6$, $F_2$, HF, $ClF_3$, $Cl_2$, HCl, $BCl_3$ and HBr.

Thus a gas can be selected depending on various conditions.

For the above semiconductor device manufacturing method, preferably the oxidation rate adjusting substance is an oxidation restraining substance and the first gate oxide film is thinner than the second gate oxide film.

Thus, if gate oxidation is applied to the first and second regions simultaneously, the first region with the oxidation restraining substance added thereto can be thinner in gate oxide film thickness than the second region without the oxidation restraining substance added thereto.

For the above semiconductor device manufacturing method, preferably the oxidation restraining substance is nitrogen.

Thus the oxidation restraining effect of nitrogen can be utilized.

For the above semiconductor device manufacturing method, a gas containing the oxidation rate adjusting substance is preferably a gas containing at least one selected from the group consisting of $N_2$, $N_2O$ and $NO_x$.

Thus, a gas can be selected depending on various conditions.

Preferably the above semiconductor device manufacturing method further includes the steps of: depositing a conductive layer and a covering layer successively on the first and second gate oxide films; selectively removing and patterning the conductive layer and the covering layer; with the patterned conductive layer and covering layer used as a mask, forming an element separation structure at a region from which the conductive layer and the covering layer are removed; and further patterning the patterned conductive layer to form a gate electrode layer.

According to this method, a conductive layer is formed before an element isolation structure is formed, to avoid forming the conductive layer on a step resulting from the element isolation structure, as is when a conductive layer is formed after an element separation structure is formed. Thus, if the conductive layer is patterned in forming the gate electrode, any residue of the conductive layer will not be produced at a sidewall of an underlying step. Preventing such production of the residue can prevent disadvantageous short-circuit between conductive layers.

For the above semiconductor device manufacturing method, preferably the step of forming an element separation structure includes the step of applying a thermal oxidation process with the patterned conductive layer and covering layer used as a mask to form a field oxide film at a main surface of the semiconductor substrate.

Thus, the field oxide film can be formed while production of residue can be prevented.

For the above semiconductor device manufacturing method, preferably the step of forming an element separation structure includes the steps of: etching a main surface of the semiconductor substrate with the patterned conductive layer and covering layer used as a mask to form a trench in the main surface of the semiconductor substrate; and filling the trench with a buried layer to form a trench separation structure.

Thus the trench separation structure can be formed while production of residue can be prevented.

Preferably the above semiconductor device manufacturing method further includes the following steps:

Initially a first conductive layer, an insulation layer and a covering layer are deposited successively on the first and second gate oxide films. Then the first conductive layer, the insulation layer and the covering layer are selectively removed and patterned such that they remain on each of the first and second gate oxide films. Then, the patterned first conductive layer, insulation layer and covering layer are used as a mask for etching a main surface of the semiconductor substrate to form a trench in the main surface of the semiconductor substrate. Then a buried layer is formed which fills the trench and an upper surface of which is located higher than an upper surface of the first conductive layer. Then the covering layer is entirely removed to expose the insulation layer. Then the insulation layer on one gate oxide film of the first and second gate oxide films and a portion of the buried layer adjacent to the insulation layer on one gate oxide film are isotropically etched to remove the insulation layer on one gate oxide film to thus expose the conductive layer on one gate oxide film as well as form a gentle sidewall at the buried layer. Then a second conductive layer is formed in contact with the first conductive layer on one gate oxide film and in contact with the insulation layer on the other gate oxide film. Then the first and second conductive layers are patterned to form a first gate electrode layer formed of the first and second conductive layers on one gate oxide film and a second gate electrode layer formed of the first conductive layer on the other gate oxide film.

According to this method, the isolation layer on either one of the gate oxide films is etched away through isotropic etching. This isotropic etching results in a gentle, round sidewall of the etched portion. Accordingly, if the second conductive layer is formed thereon and patterned for forming a gate electrode, residue of the second conductive layer is hardly produced at the gentle sidewall portion. Thus, production of residue of the second conductive layer can be restrained in providing a gate electrode layer in a deposited structure of the first and second conductive layers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to the drawings.

First Embodiment

Figure 1:
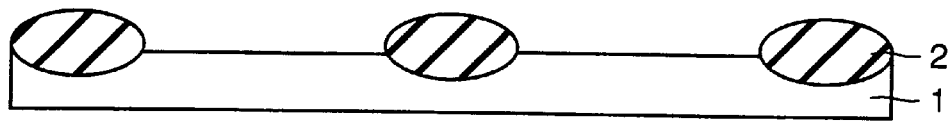
FIGS. 1–7 are schematic cross sectional views illustrating steps of a method of manufacturing a semiconductor device having a dual gate oxide according to a first embodiment of the present invention.

Referring first to FIG. 1, local oxidation of silicon (LOCOS) and the like is employed to form a field oxide film 2 for insulating elements at a surface of a silicon substrate 1.

Figure 2:
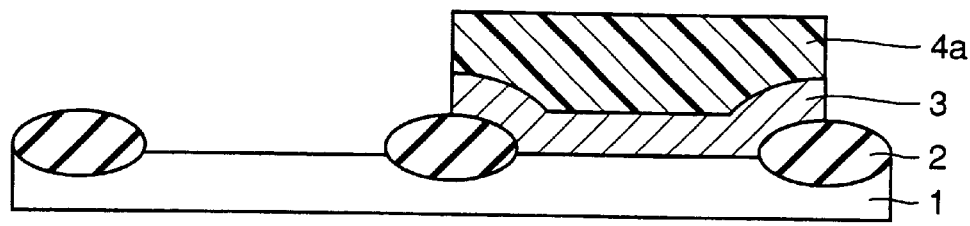

Referring to FIG. 2, a masking layer 3 formed of e.g. silicon oxide film (or silicon nitride film) is formed on the entire surface of a silicon substrate 1. Photoresist 4a is applied on masking layer 3 and then patterned to form a resist pattern 4a. With resist pattern 4a used as a mask, masking layer 3 is anisotropically etched. Thus, masking pattern 3 is left on a region excluding a region in which a thick gate oxide film is desired. Then, resist pattern 4a is removed.

While resist 4a can be applied directly on silicon substrate 1 without using masking pattern 3, such application may degrade the film quality and reliability of the gate oxide film formed in the subsequent steps.

Figure 3:
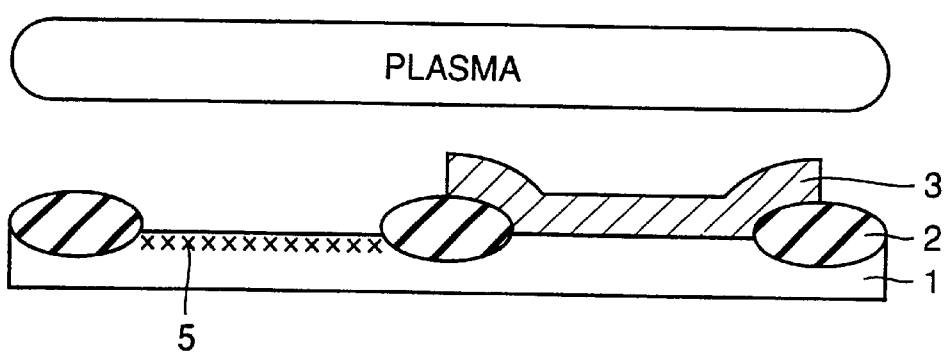

Referring to FIG. 3, silicon substrate 1 is exposed to a plasma containing a halogen (in particular, a gas containing F, Cl; $NF_3$, $SF_6$, $F_2$, HF, $ClF_3$, $Cl_2$, HCl, $BCl_3$ or the like) to add a halogen 5 to a surface of silicon substrate that is not covered by masking pattern 3. Halogen 5 is added to distribute within a depth range of no more than 2 nm from the surface of silicon substrate 1. Then, hydrofluoric acid is used to remove masking pattern 3. If masking pattern 3 is formed of silicon nitride film, thermal phosphoric acid is used to remove masking pattern 3.

Figure 4:
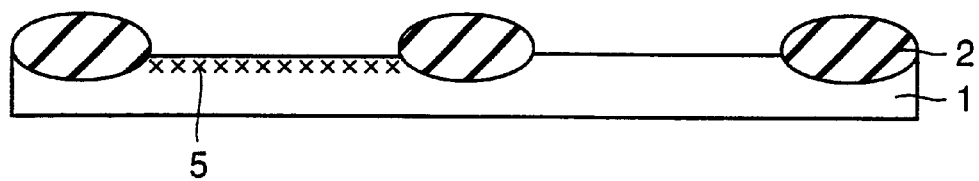

Referring to FIG. 4, the removal of the masking pattern exposes a surface of silicon substrate 1 in a region without halogen 5 added thereto. In this condition, a thermal oxidation process is applied to the surface of silicon substrate 1.

Figure 5:
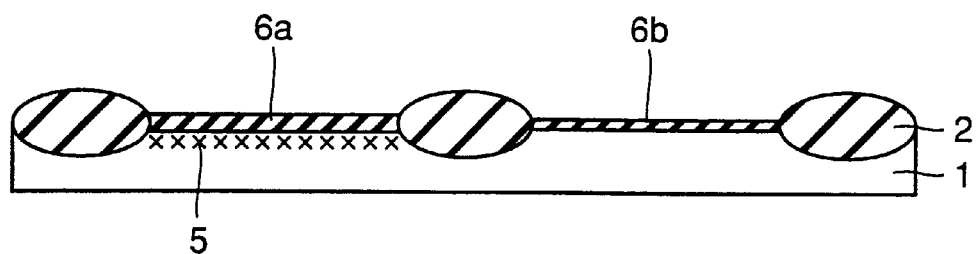

Referring to FIG. 5, thus the oxidation promoting effect of halogen 5 accelerates oxidation rate in the region with halogen 5 added thereto (or the region is oxidized at an increased rate). Thus a gate oxide film 6a in the region with halogen 5 added thereto is greater in thickness than a gate oxide film 6b in the region without halogen 5 added thereto to form a dual gate oxide.

Figure 8:
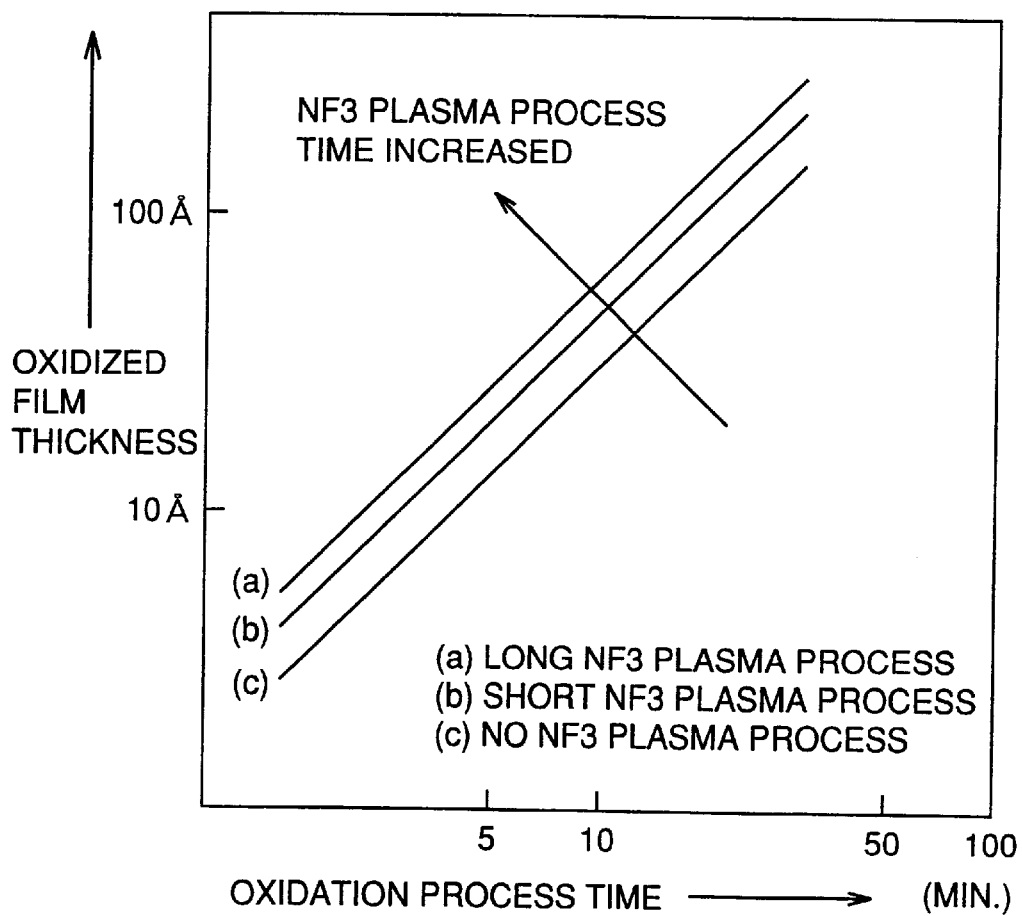
FIG. 8 shows a relation between oxidation process time and oxidized film thickness between a case with a plasma process applied and a case without a plasma process applied.

The degree of the oxidation at an increased rate can be advantageously controlled depending on plasma process time (in a range of approximately 10 to 120 seconds), as shown in FIG. 8.

Figure 6:
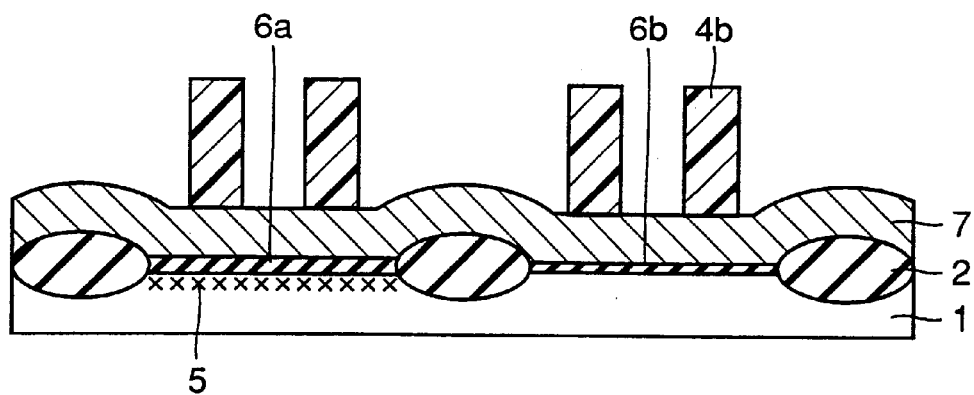

Referring to FIG. 6, a conductive layer 7 which will serve as a gate electrode is formed on the entire surface of silicon substrate 1. Conductive layer 7 is of e.g. polycrystalline silicon, amorphous silicon, W, WSi/polycrystalline silicon, TiSi/polycrystalline silicon, MoSi/polycrystalline silicon or the like, or a film formed thereof that contains at least one of As, P, B and N. A normal photolithography technique is employed to form a resist pattern 4b on conductive layer 7. With resist pattern 4b used as a mask, conductive layer 7 is etched. Then, resist pattern 4b is removed.

Figure 7:
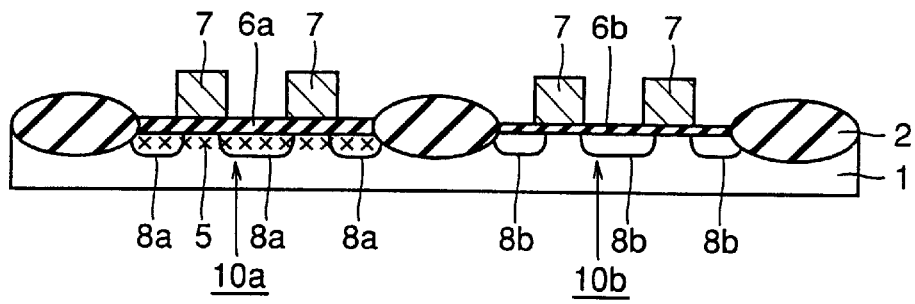

Referring to FIG. 7, the above etching causes conductive layer 7 to be patterned to form a gate electrode layer 7. With gate electrode layer 7, field oxide film 2 and the like used as a mask an impurity is injected to form source/drain region 8a, 8b at a surface of silicon substrate 1. Thus a MOS transistor 10a having a thick gate oxide film 6a and a MOS transistor 10b having a thin gate oxide film 6b are obtained.

In the semiconductor device thus formed, an oxidation promoting substance 5 such as a halogen is added to a surface of silicon substrate 1 underlying relatively thick gate oxide film 6a, as shown in FIG. 7. Oxidation promoting substance 5 is distributed only within a depth range of no more than 2 nm from the surface of silicon substrate 1.

According to the present embodiment, oxidation promoting substance 5 such as a halogen is added by exposing a surface of silicon substrate 1 to plasma. The energy in adding oxidation promoting substance 5 is in the order of several ten eV, which is significantly reduced as compared with the ion injection requiring an energy of several keV to several ten keV. This reduces damage such as lattice defect in the region of silicon substrate 1 with halogen 5 added thereto. Thus the damage can readily be repaired simply through e.g. the thermal oxidation for forming a gate oxide film (FIGS. 4 and 5). This can eliminate the necessity of adding a new thermal oxidation step for damage repair as in conventional ion injection and thus simplify the process.

Furthermore, since the surface of silicon substrate 1 is exposed to plasma, the surface of silicon substrate 1 is light-etched and thus cleaned. Accordingly, gate oxide film 6a formed on the cleaned surface has very good film quality and a MOS transistor with good characteristics can thus be manufactured.

It should be noted that while the present embodiment employs field oxide film 2 as an element separation structure, a trench separation structure may also be used.

According to the present invention, conductive layer 3 for a gate electrode is formed after an element separation structure is formed. However, conductive layer 3 for a gate electrode may be formed before the element separation structure is formed. This example will now be described with reference to the second and third embodiments described below.

Second Embodiment

Figure 9:
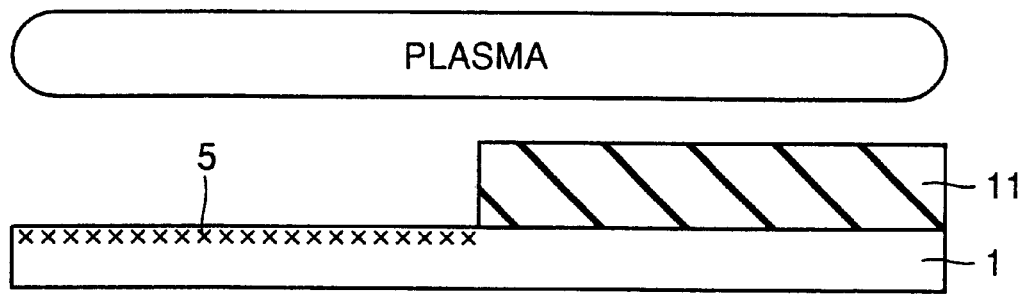
FIGS. 9–17 are schematic cross sectional views illustrating steps of a method of manufacturing a semiconductor device having a dual gate oxide according to a second embodiment of the present invention.

Referring first to FIG. 9, normal photolithography and etching techniques are employed to form a masking pattern 11 of e.g. silicon oxide film on a silicon substrate 1 at a region excluding a region in which a thick gate oxide film is desired. Then, a surface of silicon substrate 1 that is not covered by masking pattern 11 is exposed to a plasma containing a halogen (in particular, a gas containing F, Cl; $NF_3$, $SF_6$, $F_2$, HF, $ClF_3$, $Cl_2$, HCl, $BCl_3$ or the like). Thus a halogen 5 is added to the exposed region of silicon substrate 1. Halogen 5 is added to distribute only within a depth range of no more than 2 nm from the surface of silicon substrate 1. Then, masking pattern 11 is removed.

Figure 10:
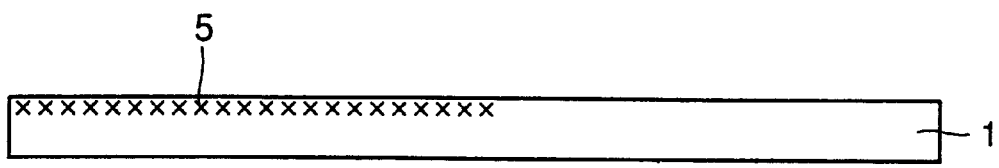

Referring to FIG. 10, the removal of the masking pattern exposes the entire surface of silicon substrate 1. In this condition a thermal oxidation process is applied to the surface of silicon substrate 1.

Figure 11:
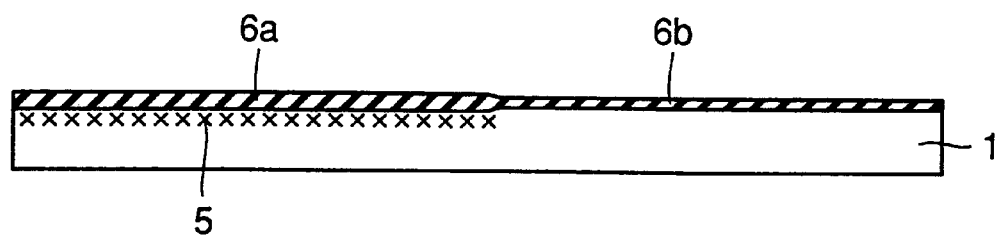

Referring to FIG. 11, thus the region with halogen 5 added thereto has oxidation rate to be accelerated. Thus, a gate oxide film 6a in the region with halogen 5 added thereto is greater in thickness than a gate oxide film 6b in the region without halogen 5 added thereto to form a dual gate oxide.

Figure 12:
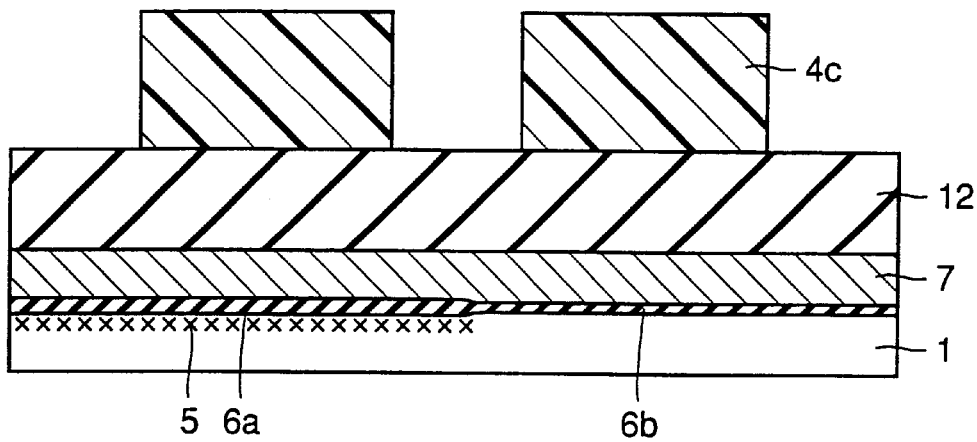

Referring to FIG. 12, a conductive layer 7 and an oxidation-resistant covering layer 12 formed of e.g. silicon nitride film are successively formed on gate oxide films 6a and 6b. Conductive layer 7 is formed of polycrystalline silicon, amorphous silicon, polycrystalline silicon injected with an impurity, amorphous silicon injected with an impurity, or the like. A normal photolithography technique is employed to form a resist pattern 4c on oxidation-resistant covering layer 12. Oxidation-resistant covering layer 12 and conductive layer 7 are etched with resist pattern 4c used as a mask. Then, resist pattern 4c is removed.

Figure 13:
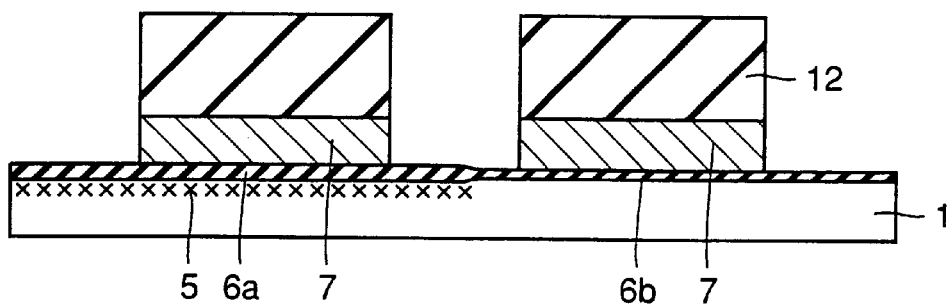

Referring to FIG. 13, the etching causes conductive layer 7 and oxidation-resistant covering layer 12 to be patterned in a predetermined pattern and oxidation-resistant covering layer 12 thus constitutes an oxidation-resistant mask.

Figure 14:
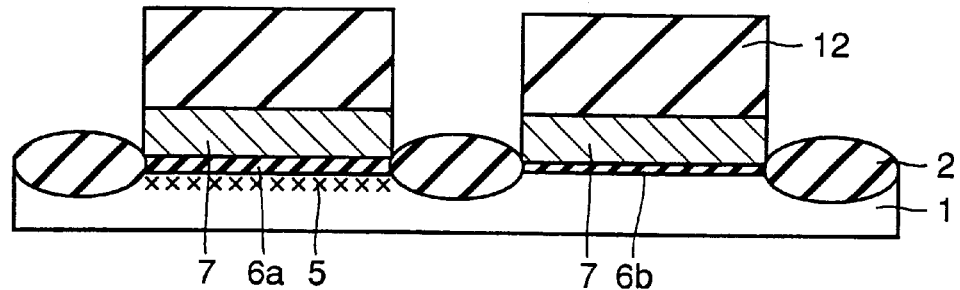

Referring to FIG. 14, with oxidation-resistant mask 12 thus formed, a thermal oxidation process is applied to form a field oxide film 2 in a region which is not covered by oxidation-resistant mask 12. Then, thermal phosphoric acid is used to remove oxidation-resistant mask 12.

Figure 15:
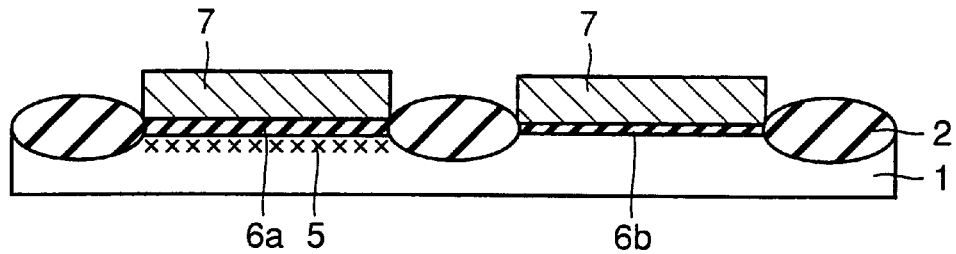

Referring to FIG. 15, an upper surface of conductive layer 7 is thus exposed.

Figure 16:
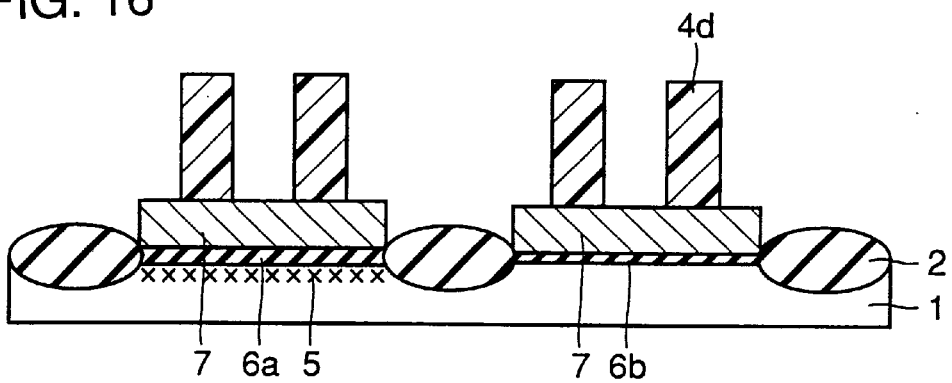

Referring to FIG. 16, a normal photolithography technique is employed to form a resist pattern 4d on conductive layer 7. Conductive layer 7 is etched with resist pattern 4d used as a mask. Then, resist pattern 4d is removed.

Figure 17:
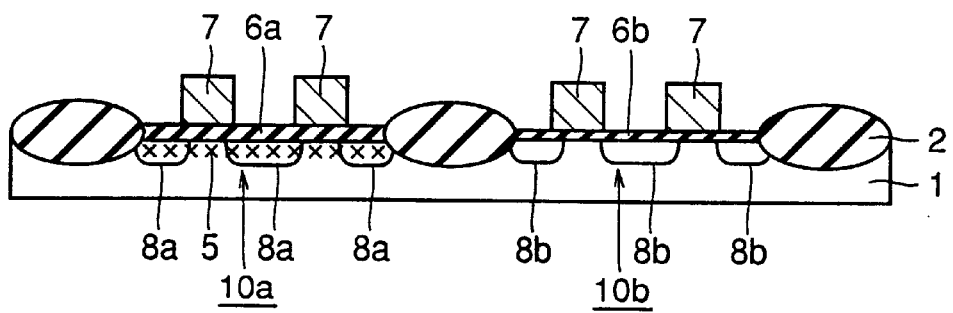

Referring to FIG. 17, the etching causes conductive layer 7 to be patterned to form a gate electrode layer 7. With gate electrode layer 7, field oxide film 2 and the like used as a mask, an impurity is ion-implanted to form a source/drain region 8a, 8b at a surface of silicon substrate 1. Thus, a MOS transistor 10a having thick gate oxide film 6a and a MOS transistor 10b having thin gate oxide film 6b are obtained.

In the semiconductor device thus formed, an oxidation promoting substance 5 such as a halogen is added to a surface of silicon substrate 1 underlying relatively thick gate oxide film 6a, as shown in FIG. 17. Oxidation promoting substance 5 distributes only within a depth range of no more than 2 nm from the surface of silicon substrate 1.

According to the present embodiment, conductive layer existing since the formation of field oxide film 2 is directly processed as a gate electrode (FIGS. 16 and 17). This can eliminate the necessity of separately providing the formation of a conductive layer required in forming field oxide film 2 and the formation of a conductive layer for a gate to simplify the manufacturing process.

Furthermore, forming conductive layer 7 for a gate prior to forming field oxide film 2 prevents formation of conductive layer 7 for a gate on a step created by field oxide film 2, as in forming conductive layer 7 for a gate after forming field oxide film 2. Thus, when conductive layer 7 for a gate is patterned as shown in FIGS. 16 and 17, residue of conductive layer 7 for a gate is not produced at a sidewall of the underlying step otherwise created. This prevents disadvantageous residue-caused short circuit caused between other conductive layers and the like.

While the present embodiment employs field oxide film 2 as an element separation structure, a trench separation structure may be employed as the element separation structure. An example using a trench separation structure will now be described in the following third embodiment.

Third Embodiment

Figure 18:
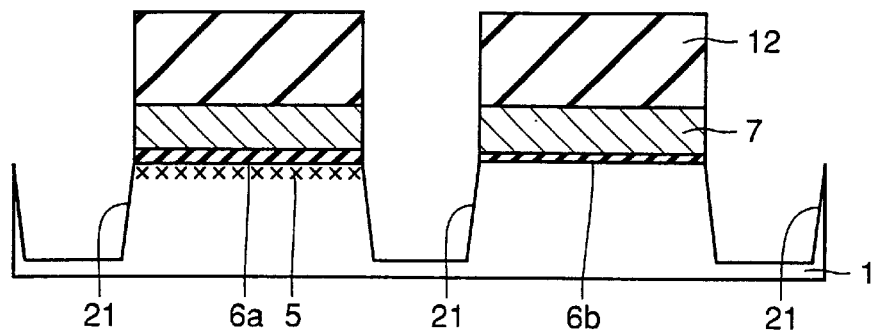
FIGS. 18–22 are schematic cross sectional views illustrating steps of a method of manufacturing a semiconductor device having a dual gate oxide according to a third embodiment of the present invention.

The manufacturing method according to the present embodiment first goes through steps similar to those of the second embodiment that are shown in FIGS. 9–13. Then, referring to FIG. 18, a portion which is not covered by mask 7, 12 is etched to selectively form a gap 21 in a surface of silicon substrate 1.

Figure 19:
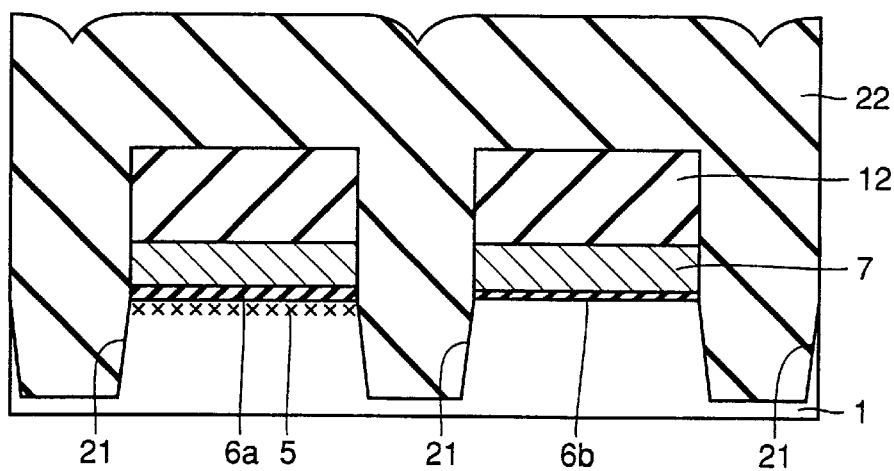

Referring to FIG. 19, an insulation layer 22 formed of e.g. silicon oxide film is formed to fill gap 21 and cover mask 7, 12. Then, chemical mechanical polish(CMP) or etch back is applied to buried insulation layer 22 until a surface of covering layer 12 is exposed. Then a hydrofluoric acid treatment is applied to etch away covering layer 12 and buried insulation layer 22.

Figure 20:
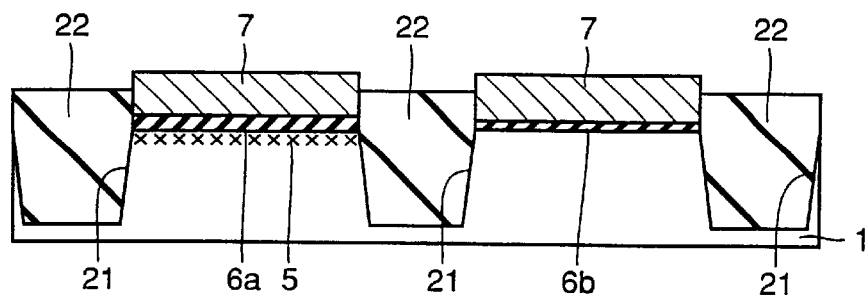

Referring to FIG. 20, the etching is adjusted so that a surface of silicon substrate 1 and an upper surface of buried insulation layer 22 are as level with each other as possible. This etching causes an upper surface of conductive layer 7 to be exposed.

Figure 21:
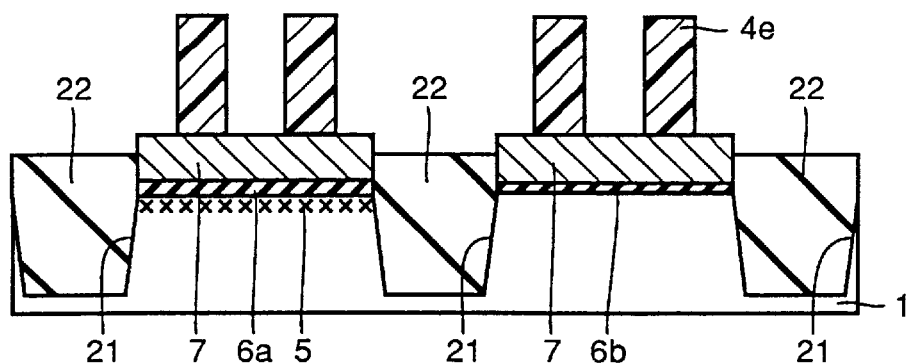

Referring to FIG. 21, a normal photolithography technique is employed to form a resist pattern 4e on conductive layer 7. Conductive layer 7 is etched with resist pattern 4e used as a mask. Then, resist pattern 4e is removed.

Figure 22:
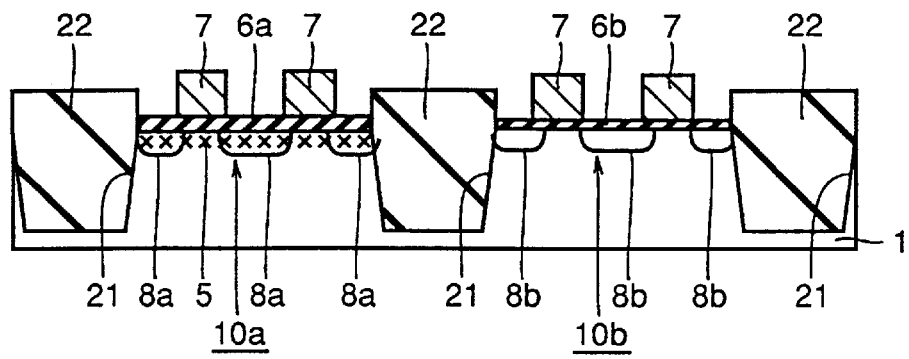

Referring to FIG. 22, the etching causes conductive layer 7 to be patterned to form gate electrode layer 7. With gate electrode layer 7, buried insulation layer 22 and the like used as a mask, an impurity is ion-implanted into silicon substrate 1 to form source/drain regions 8a, 8b at a surface of silicon substrate 1. Thus a MOS transistor 10a having thick gate oxide film 6a and a MOS transistor 10b having thin gate oxide film 6b are obtained.

In the semiconductor device thus formed, an oxidation promoting substance 5 such as a halogen is added to a surface of silicon substrate 1 underlying relatively thick gate oxide film 6a, as shown in FIG. 22. Oxidation promoting substance 5 distributes only within a depth range of no more than 2 nm from the surface of silicon substrate 1.

In the present embodiment also, conductive layer 7 which will serve as a gate electrode can be used as a mask for forming a trench separation structure to simplify the manufacturing process, as is similar to the second embodiment.

Furthermore, residue of conductive layer 7 is hardly produced in forming a gate electrode since conductive layer 7, which will serve as the gate electrode, is formed before a trench separation structure is formed. This fact will now be more specifically described.

Figure 23:
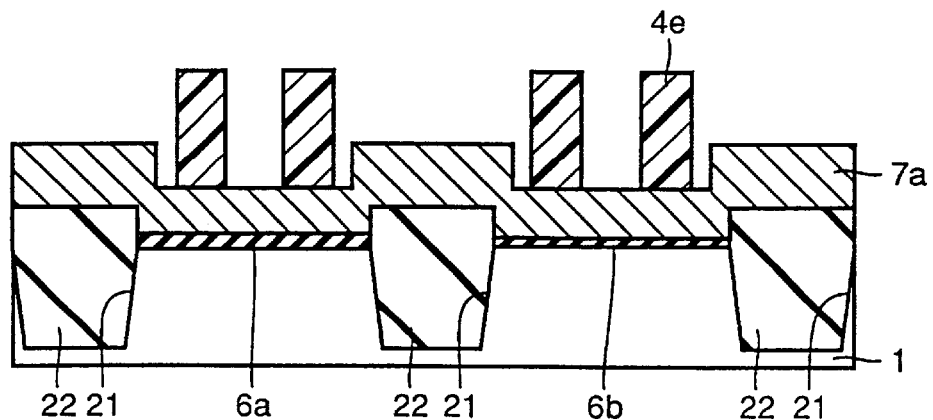
FIGS. 23 and 24 shows steps, illustrating a disadvantage when a conductive layer for a gate is formed after an element separation structure is formed.
Figure 24:
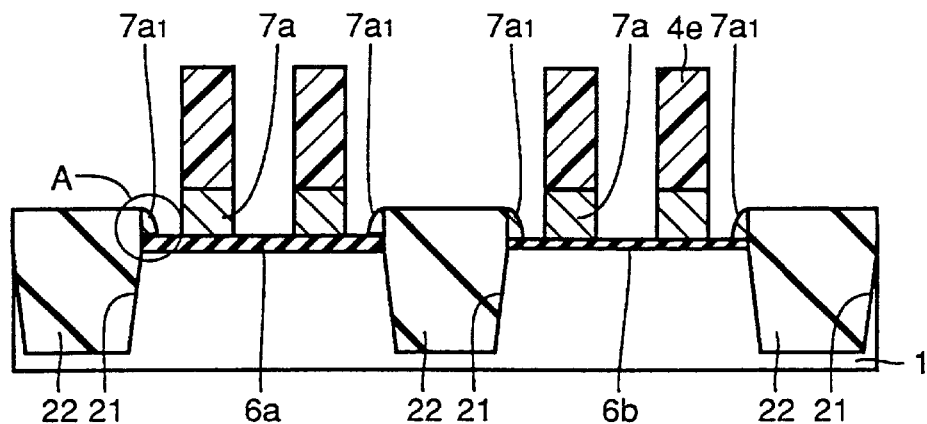

In the trench separation structure, a step can result since an upper surface of buried insulation layer 22 configuring the trench separation structure protrudes from an upper surface of silicon substrate 1, as shown in FIG. 23. If conductive layer 7a which will serve as a gate electrode is formed in this condition and then patterned using a resist pattern 4e, as shown in FIG. 24, a residue $7a_1$ of conductive layer 7 can be disadvantageously produced at a sidewall (a region A) of the step resulting from the trench separation structure and thus cause short-circuit between other conductive layers.

By contrast, according to the present embodiment, conductive layer 7 which will serve as a gate electrode is initially formed and a trench separation structure is then formed. In other words, conductive layer 7 which will serve as a gate electrode will not be formed on a step resulting from a trench separation structure. Thus, when conductive layer 7 is patterned as shown in FIGS. 21 and 22, any residue of conductive layer 7 will not be left on a sidewall of the step of the trench separation structure. Thus, conductive layers are prevented from disadvantageous residue-caused short-circuit and the like.

Although the first to third embodiments has been described with an oxidation promoting substance such as a halogen used as the oxidation rate adjusting substance, an oxidation restricting substance may be used as the oxidation rate adjusting substance. An example using an oxidation restricting substance will now be described in a fourth embodiment.

Fourth Embodiment

Figure 25:
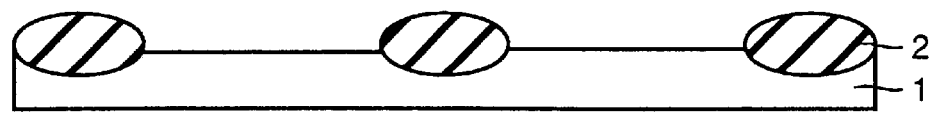
FIGS. 25–31 are cross sectional views illustrating steps of a method of manufacturing a semiconductor device having a dual gate oxide according to a fourth embodiment of the present invention.

Referring to FIG. 25, the LOCOS technique or the like is used to form a field oxide film 2 at a surface of silicon substrate 1.

Figure 26:
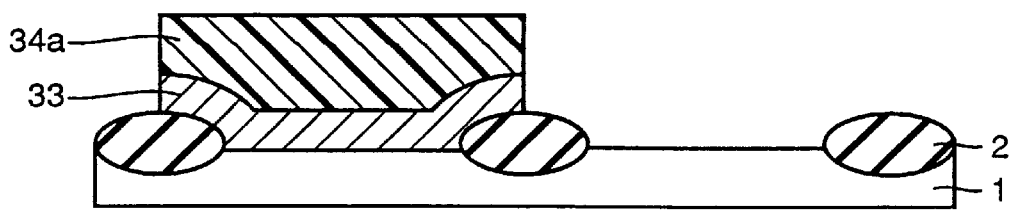

Referring to FIG. 26, a masking layer 33 of e.g. silicon oxide film (or silicon nitride film) is formed on the entire surface. A normal photolithography technique is employed to form a resist pattern 34a on masking layer 33. With resist pattern 34a used as a mask, masking layer 33 is etched to leave a masking pattern 33 in a region other than a region in which a thin gate oxide film is desired. Then, resist pattern 30a is removed.

Figure 27:
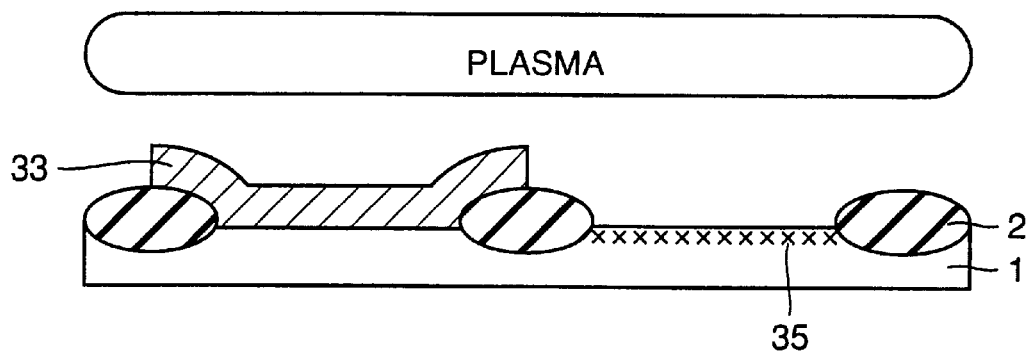

Referring to FIG. 27, a surface of silicon substrate 1 that is not covered by masking pattern 33 is exposed to a plasma containing nitrogen (N) (in particular, $N_2$, O, $NO_x$ and the like as the gas containing N). Thus, nitrogen 35 is added to the surface of silicon substrate 1 that is not covered by masking pattern 33. Nitrogen 35 is added to distribute only within a depth range of no more than 2 nm from the surface of silicon substrate 1. Then, hydrofluoric acid is used to remove masking pattern 33. If masking pattern 33 is formed of silicon nitride film, thermal phosphoric acid is used to remove masking pattern 33.

Figure 28:
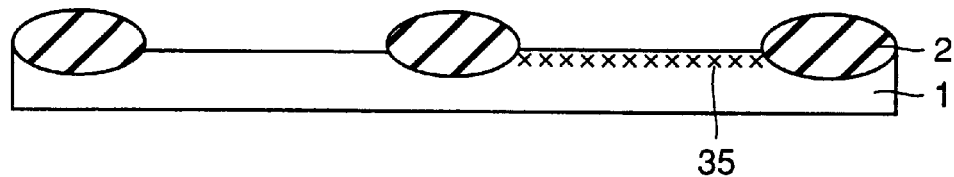

Referring to FIG. 28, the removal of the masking pattern exposes a surface of silicon substrate 1 to which nitrogen 35 is not added. In this condition a thermal oxidation process is applied to the silicon substrate 1 surface.

Figure 29:
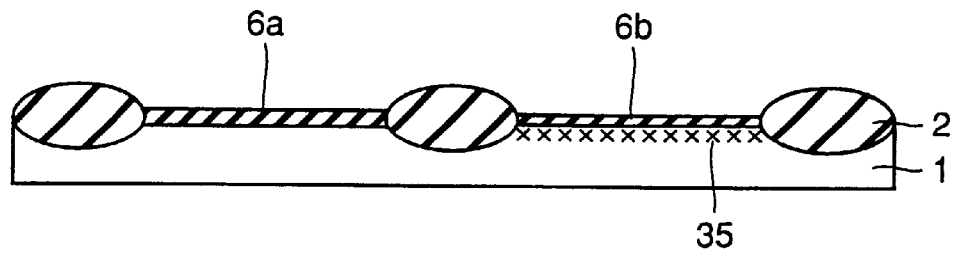

Referring to FIG. 29, in this thermal oxidation process, the oxidation rate in the region with nitrogen 35 added thereto decelerates due to an oxidation restraining effect of nitrogen 35. Thus, gate oxide film 6b in the region with nitrogen 35 added thereto is thinner than gate oxide film 6a in the region without nitrogen 35 added thereto to form a dual gate oxide.

Figure 30:
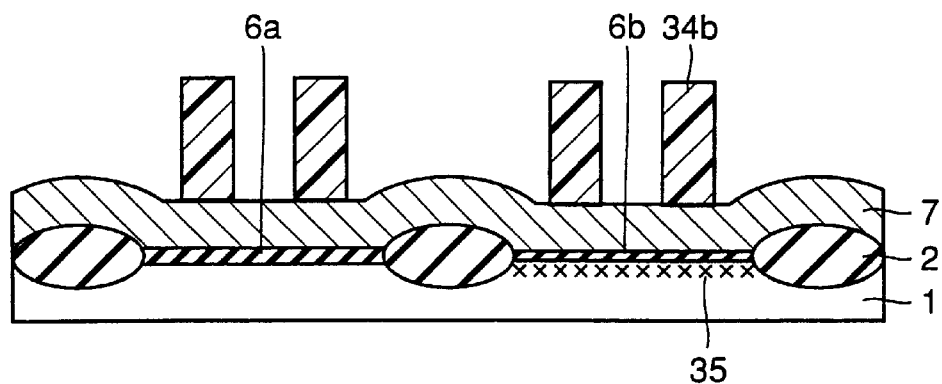

Referring to FIG. 30, conductive layer 7 which will serve as a gate electrode is formed on the entire surface of silicon substrate 1. Conductive layer 7 is of e.g. polycrystalline silicon, amorphous silicon, W, WSi/polycrystalline silicon, TiSi/polycrystalline silicon, MoSi/polycrystalline silicon or the like, or these films containing at least one of As, P, B, and N. A normal photolithography technique is employed to form resist pattern 34b on conductive layer 7. Conductive layer 7 is etched with resist pattern 34 used as a mask. Then, resist pattern 34 is removed.

Figure 31:
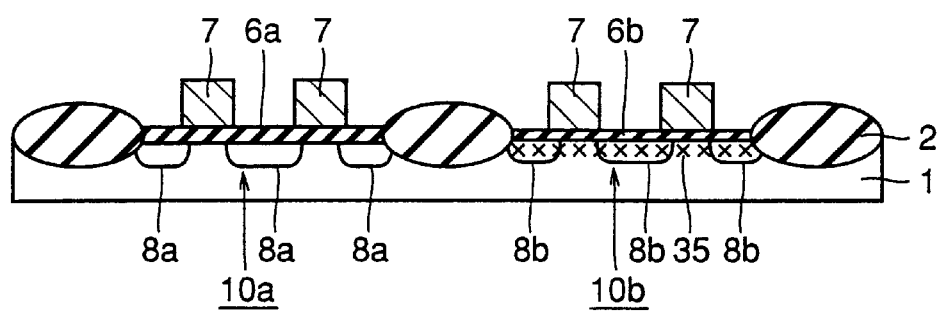

Referring to FIG. 31, the etching allows conductive layer 7 to be patterned to form a gate electrode layer 7. With gate electrode layer 7, field oxide film 2 and the like used as a mask, an impurity is injected to form source/drain region 8a, 8b at a surface of silicon substrate 1. Thus, MOS transistor 10a having thick gate oxide film 6a and MOS transistor 10b having thin gate oxide film 6b are obtained.

For the semiconductor device thus formed, an oxidation restraining substance 35 such as nitrogen is added to the surface of silicon substrate 1 that exactly underlies relatively thin gate oxide film 6b, as shown in FIG. 31. Oxidation restraining substance 35 distributes only within a depth range of 2 nm from the surface of silicon substrate 1.

In the present embodiment, as is similar to the first embodiment, an oxidation restraining substance is added to silicon substrate 1 by exposing a surface of silicon substrate 1 to plasma. Thus, the damage to the surface of silicon substrate 1 can be reduced as compared with that resulting from conventional ion injection. This can eliminate the necessity of adding a new thermal oxidation step for repairing such damage and thus simplify the process.

Furthermore, the surface of silicon substrate 1 that is exposed to plasma is light-etched and thus cleaned. Thus, the gate oxide film formed at this portion has good film quality and a MOS transistor with good characteristics can be obtained.

While in the first to fourth embodiment the gate electrode has been described as a single layer, gate electrode 7 may have a stacked structure of polycide, salicide and the like.

An example with a gate electrode layer having a stacked structure will now be described in a fifth embodiment.

Fifth Embodiment

Figure 32:
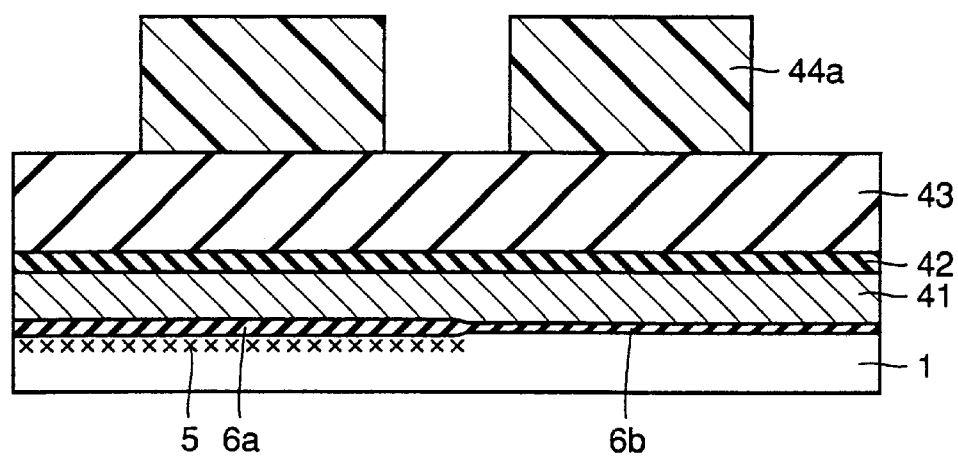
FIGS. 32–50 are schematic cross sectional views illustrating steps of a method of manufacturing a semiconductor device having a dual gate oxide according to a fifth embodiment of the present invention.

The manufacturing method according to the present embodiment first goes through steps similar to those according to the second embodiment that are shown in FIGS. 9–11. Then, referring to FIG. 32, a first conductive layer 41, an insulation layer 42 formed of e.g. silicon oxide film, and a covering layer 43 formed of e.g. silicon nitride film are formed successively on gate oxide films 6a and 6b. The first conductive layer 41 is formed of polycrystalline silicon or amorphous silicon containing at least one of P, As, B and N.

Then, a normal photolithography technique is employed to form resist pattern 44a on covering layer 43. With resist pattern 44a used as a mask, covering layer 43, insulation layer 42 and the first conductive layer 41 are etched successively. Then, resist pattern 44a is removed.

Figure 33:
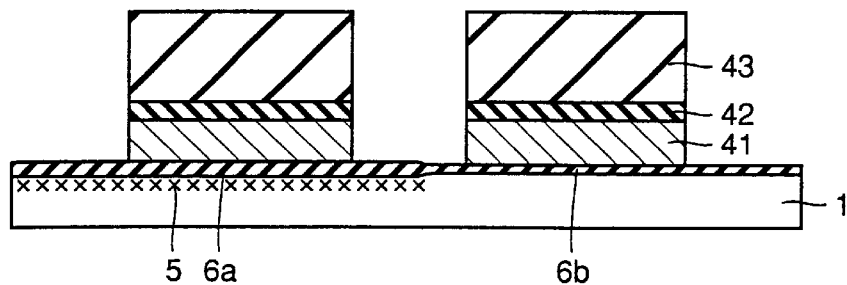

Referring to FIG. 33, the etching allows the first conductive layer 41, insulation layer 42 and covering layer 43 to be patterned into a predetermined pattern to form a masking layer 41, 42, 43 formed of the layers 41, 42 and 43. Then, gate oxide films 6a, 6b and silicon substrate 1 are etched with masking layer 41, 42 and 43 used as a mask.

Figure 34:
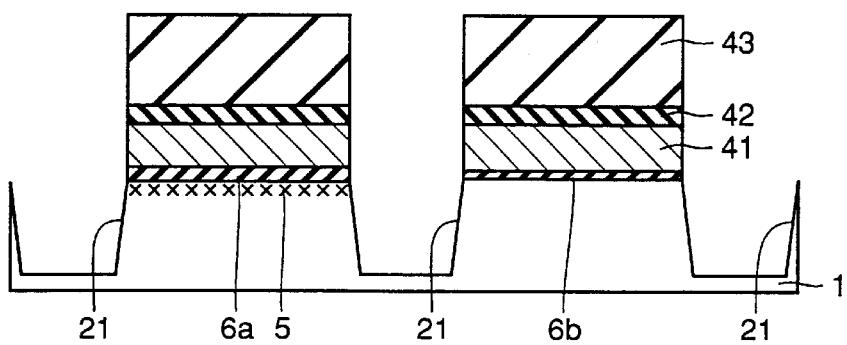

Referring to FIG. 34, the etching allows a gap 21 to be selectively formed in a surface of silicon substrate 1.

Figure 35:
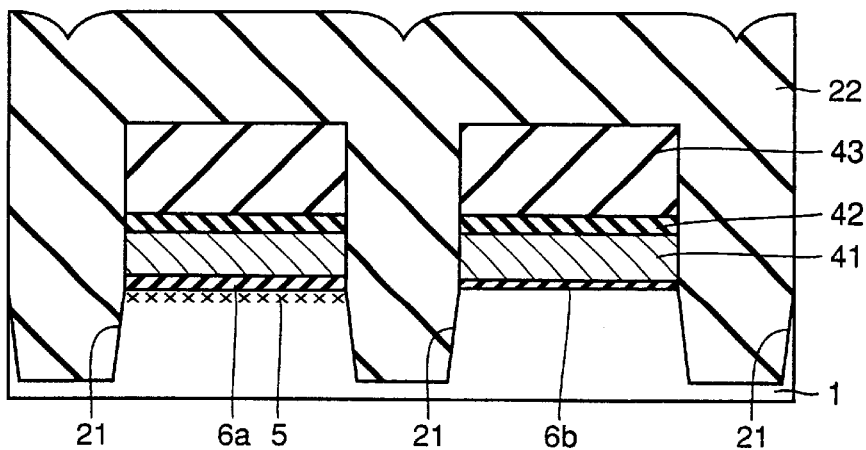

Referring to FIG. 35, a buried insulation layer 22 of e.g. silicon oxide film is formed to fill gap 21 and cover masking layer 41, 42 and 43. Then, the CMP technique or etch-back is employed to remove the buried insulation layer 22 until an upper surface of covering layer 43 is exposed.

Figure 36:
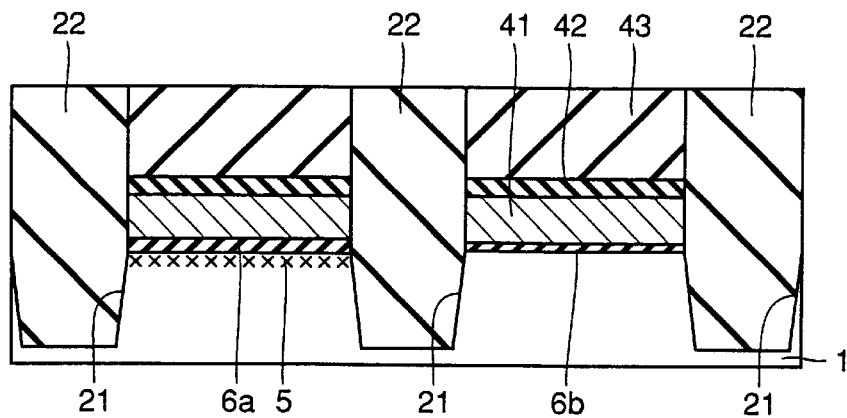

Referring to FIG. 36, an upper surface of covering layer 43 is thus exposed. Then a hydrofluoric acid process is applied to etch away covering layer 43 and buried layer insulation layer 22. During the hydrofluoric acid process, possible adjustment is made so that a surface of silicon substrate and an upper surface of buried insulation layer 22 are as level with each other as possible.

Figure 37:
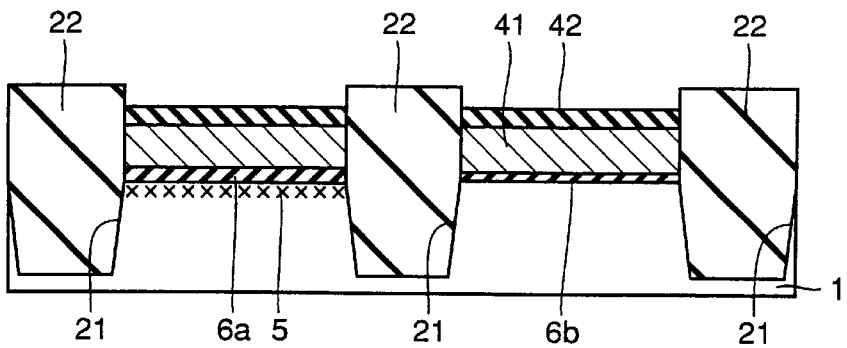

Referring to FIG. 37, the etching allows a surface of insulation layer 42 to be exposed.

Figure 38:
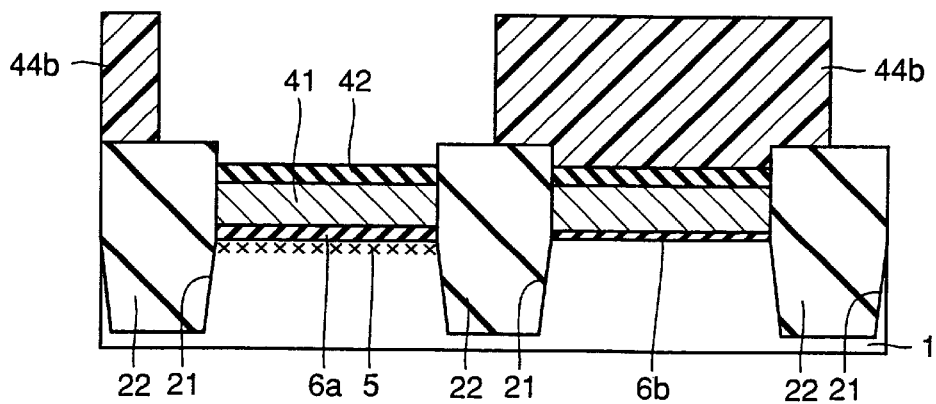

Referring to FIG. 38, a normal photolithography technique is employed to form a resist pattern 44b covering a region other than a region to which halogen 5 is added. Then with resist pattern 44b used as a mask, hydrofluoric acid is used to isotropically etch insulation layer 42 and buried insulation layer 22.

Figure 39:
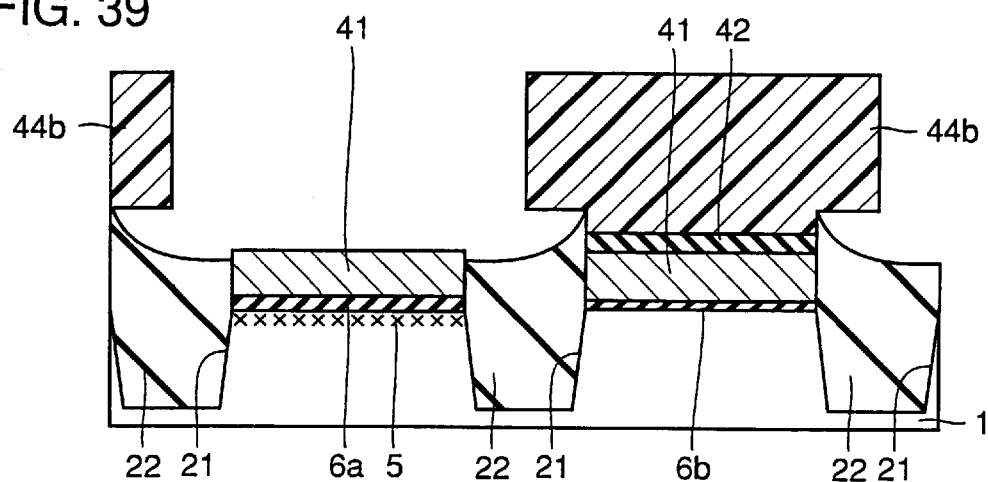

Referring to FIG. 39, the etching allows an upper surface of the first conductive layer 41 to be exposed and a sidewall of buried insulation layer 22 to be gently rounded. Then, resist pattern 44b is removed.

Figure 40:
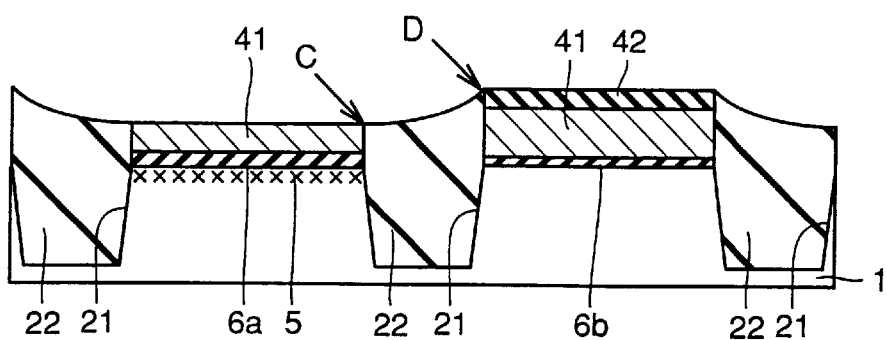

Referring to FIG. 40, an exposed portion of the first conductive layer 41 is etched back and processed so that an upper surface of the first conductive layer 41 is aligned with the surface of an end C of buried insulation layer 22. Meanwhile, an opposite end D of buried insulation layer 22 is sputtered so that the corner is rounded and thus has a gentler shape.

Figure 41:
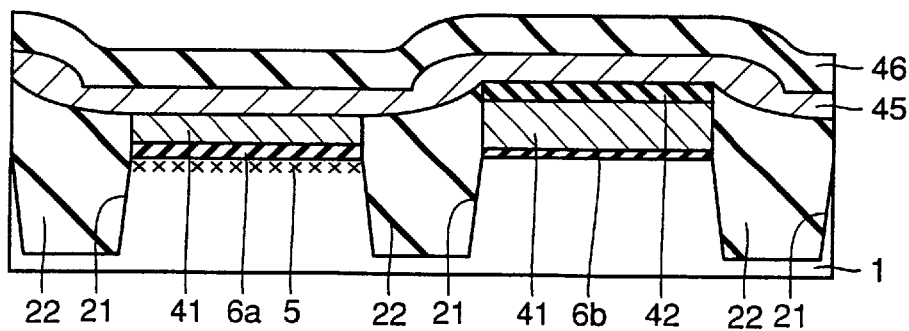

Referring to FIG. 41, a second conductive layer 45 and an insulation layer 46 formed of e.g. silicon oxide film are successively formed on the entire surface. The second conductive layer 45 is formed of e.g. W, Co, Ti, Mo, Pt, Ni or Ru, or their silicide compounds.

Figure 42:
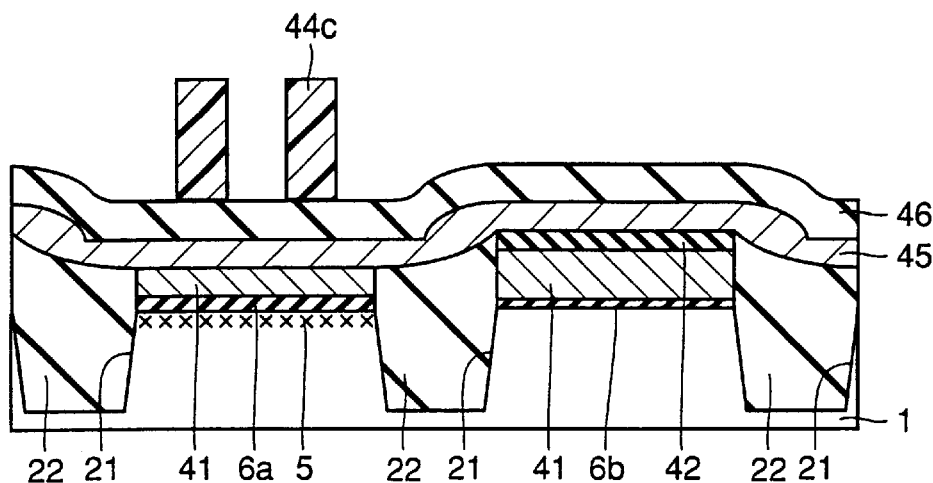

Referring to FIG. 42, a normal photolithography technique is employed to form a resist pattern 44c on insulation layer 46. Resist pattern 44 is used as a mask to etch insulation layer 46. Then, resist pattern 44c is removed.

Figure 43:
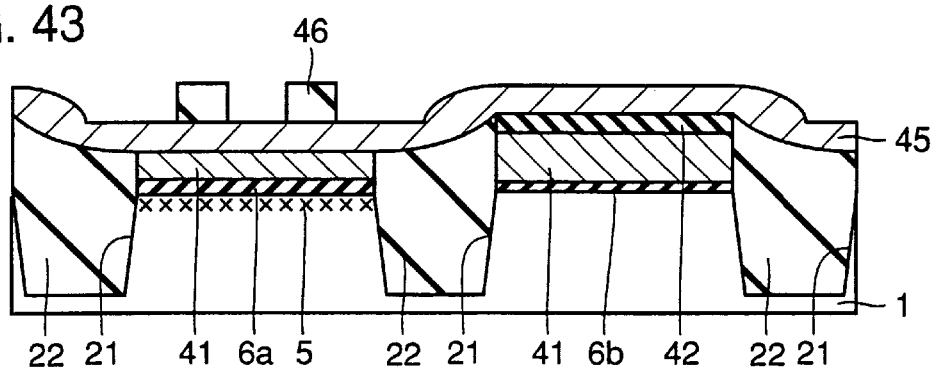

Referring to FIG. 43, the etching allows insulation layer 46 having a predetermined pattern to be left on the region to which halogen 5 is added.

Figure 44:
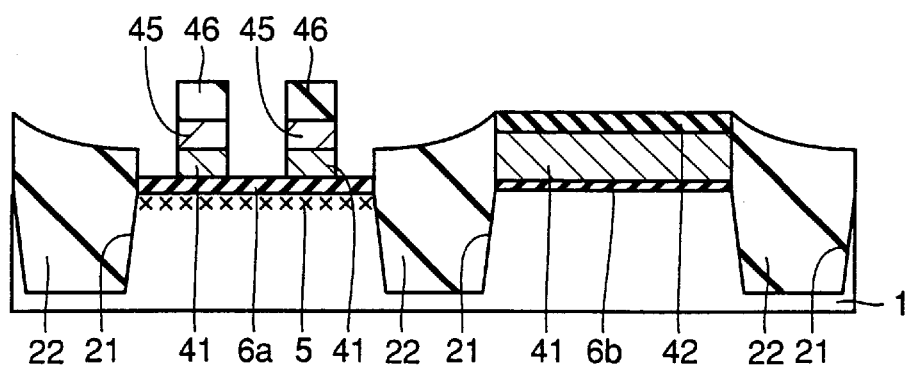

Referring to FIG. 44, with insulation layer 46 used as a mask, the first and second conductive layers 41 and 45 are etched to form a first gate electrode layer 41 and 45 formed of the first and second conductive layers 41 and 45. Furthermore, a surface of insulation layer 42 is exposed at the region to which halogen 5 is not added. Then, ions are injected into the region to which halogen 5 is added.

Figure 45:
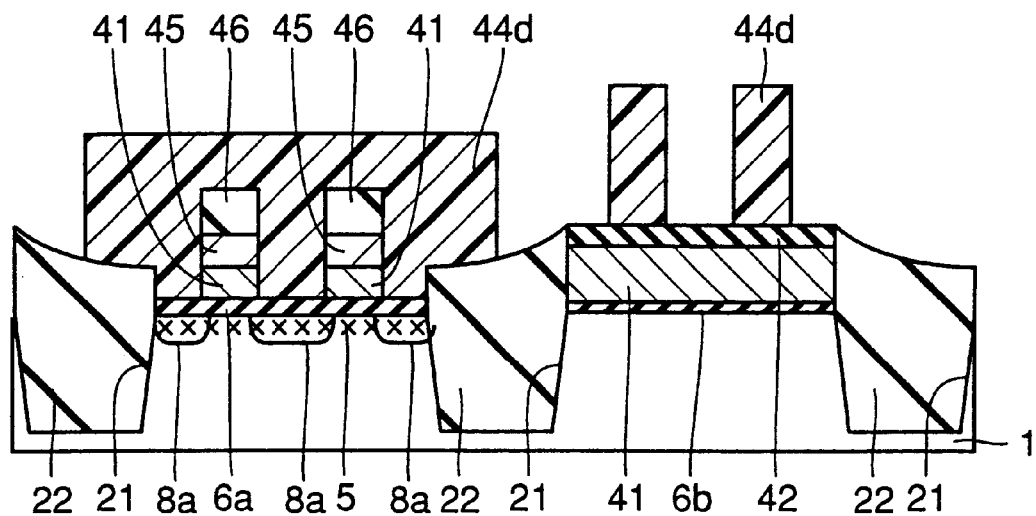

Referring to FIG. 45, the ion injection allows impurity regions 8a of relatively low concentration to be formed at surfaces of silicon substrate 1 such that they sandwich a region under the first gate electrode layer 41 and 45. A normal photolithography technique is employed to form a resist pattern 44d covering the region to which halogen 5 is added and having a predetermined shape at the region to which halogen 5 is not added. Resist pattern 44d is used as a mask to etch insulation layer 42 and the first conductive layer 41.

Figure 46:
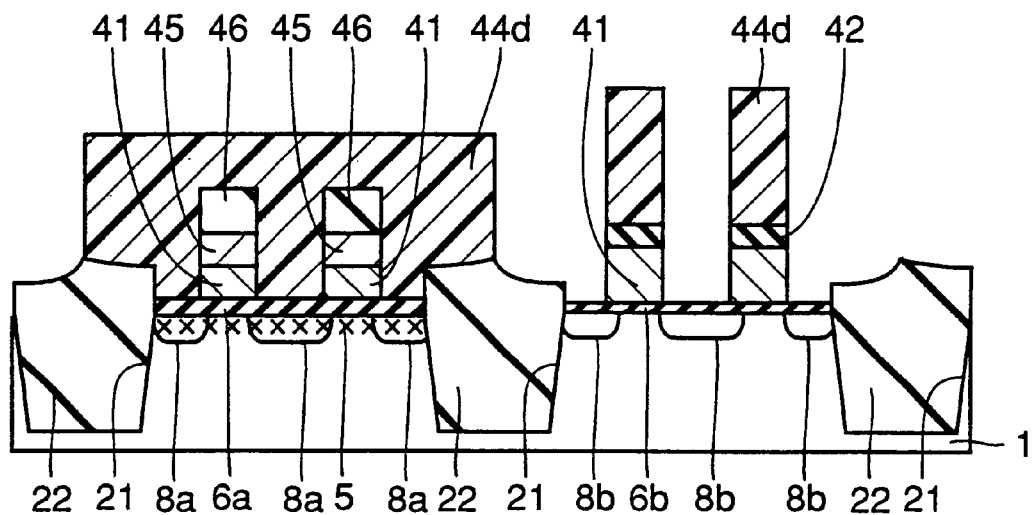

Referring to FIG. 46, the etching allows the first conductive layer 41 to be patterned to form a second gate electrode layer 41. With the second gate electrode layer 41, buried insulation layer 22 and the like used as a mask, ion injection is applied to silicon substrate 1 to form an impurity region 8b of relatively low concentration at a surface of silicon substrate 1. Then, resist pattern 44d is removed.

Figure 47:
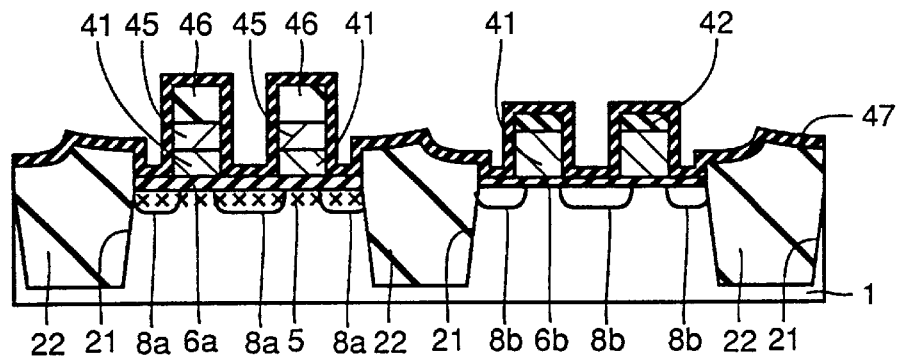

Referring to FIG. 47, an insulation layer 47 formed of e.g. silicon oxide film is formed and then etched back at its entire surface.

Figure 48:
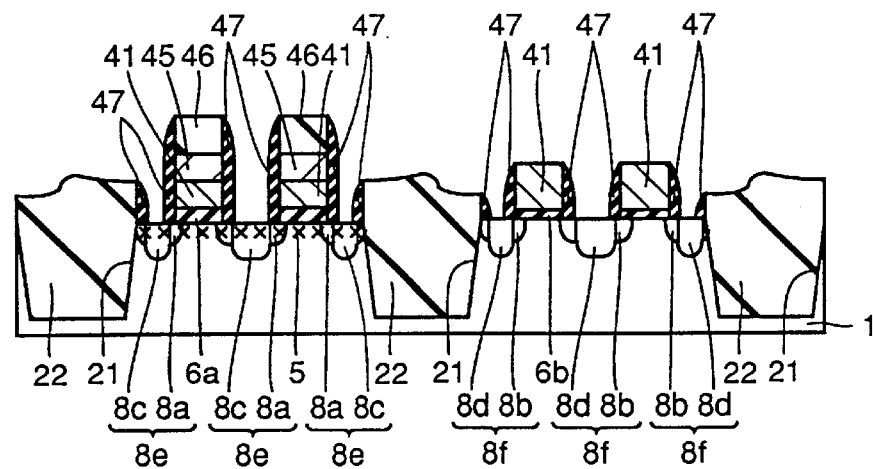

Referring to FIG. 48, the etchback allows insulation layer 47 to be left in the shape of a sidewall spacer on a sidewall of the first gate electrode layer 41 and 45 and a sidewall of the second gate electrode layer 41. The etchback also exposes a surface of impurity region 8a, a surface of impurity region 8b and an upper surface of the second gate electrode 41. With the first gate electrode layer 41 and 45, the second gate electrode layer 41, sidewall insulation layer 47, buried insulation layer 22 and the like used as a mask, an impurity is ion-implanted into silicon substrate 1. Thus, an impurity region 8c of relatively high concentration is formed at a region with halogen 5 added thereto and an impurity region 8d of relatively high concentration is formed at a region without halogen 5 added thereto. Impurity regions 8a and 8c form a source/drain region 8e having a lightly doped drain (LDD) structure and impurity regions 8b and 8d form a source/drain region 8f having LDD structure.

Figure 49:
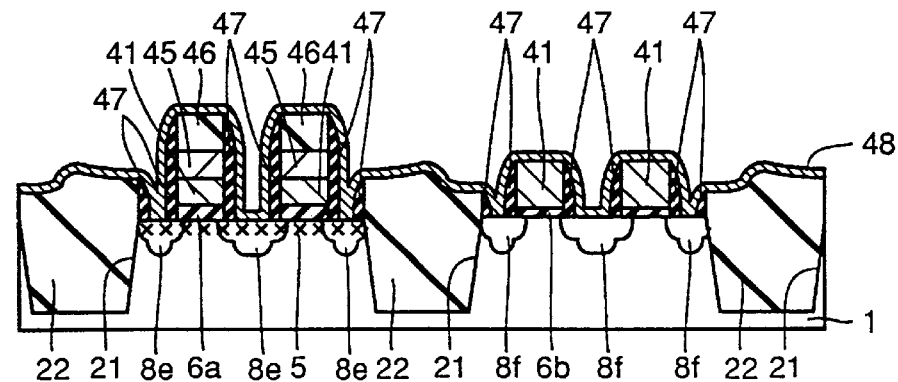

Referring to FIG. 49, a third conductive layer 48 is formed on the entire surface. The third conductive layer 48 is formed of e.g. Co, Ti, Mo, Pt, Ni or Ru, or their compounds. Then a thermal treatment is applied to achieve silicidation of a portion of the third conductive layer 48 that is in contact with source/drain regions 8e and 8f and a portion of the third conductive layer 48 that is in contact with the second gate electrode layer 41.

In the silicidation, insulation layers 47 and 22 of e.g. silicon oxide film act as silicidation protection and silicidation is thus achieved only at the region that is not covered by insulation layers 47 and 42. Then, a portion of the third conductive layer 48 that has not reacted is removed through a wet process of using $H_2SO_4/H_2O_2$ and the like.

Figure 50:
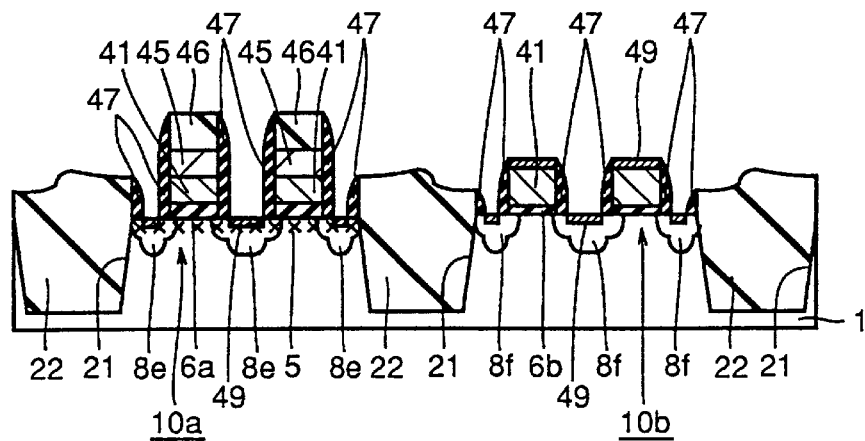

Referring to FIG. 50, the silicidation allows a silicide layer 49 to be formed at an upper surface of the second gate electrode layer 41 and a surface of source/drain region 8e, 8f. Thus, MOS transistor 10a having thick gate oxide film 6a and MOS transistor 10b having thin gate oxide film 6b are obtained.

The present embodiment has an advantage that residue is hardly produced in processing the gate electrode. This advantage will now be described in detail.

Figure 51:
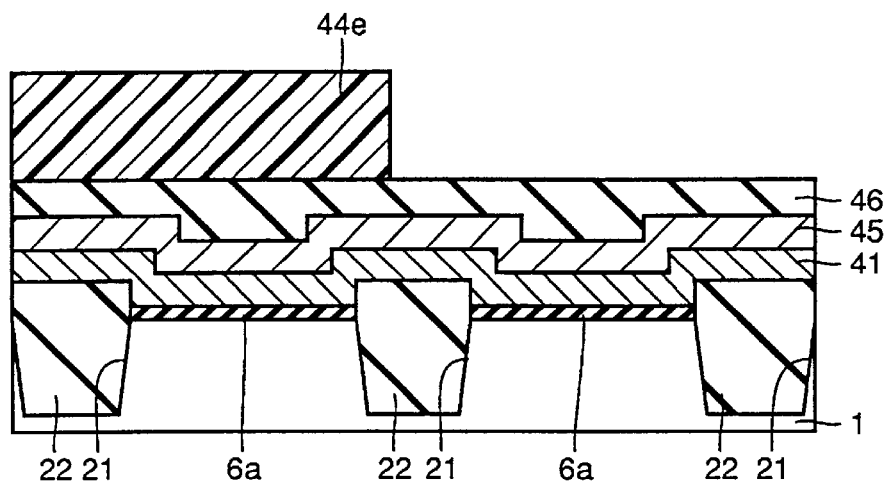
FIGS. 51–56 are step diagrams for illustrating an advantage of the fifth embodiment.

FIGS. 51–56 are schematic cross sectional views illustrating steps of the process for forming a conductive layer for a gate after formation of a trench separation structure. Referring first to FIG. 51, if a trench separation structure is first formed, an upper surface of buried insulation layer 22 can protrude from a surface of silicon substrate 1 so that a step can disadvantageously result. Thus the first and second conductive layers 41 and 45 an insulation layer 46 are formed on the step.

Figure 52:
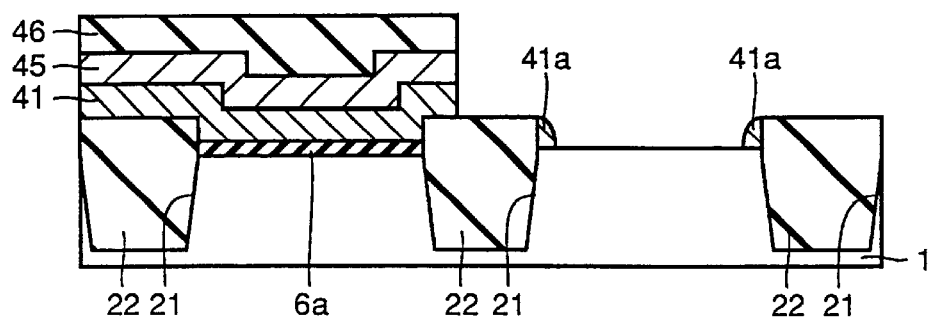
Figure 53:
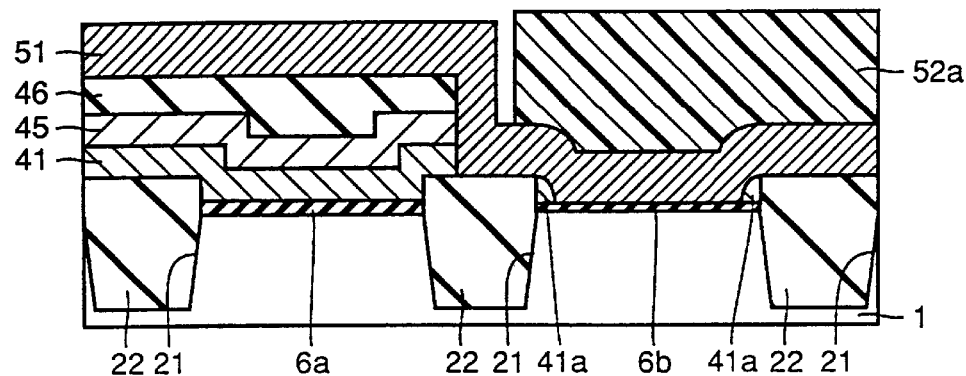
Figure 54:
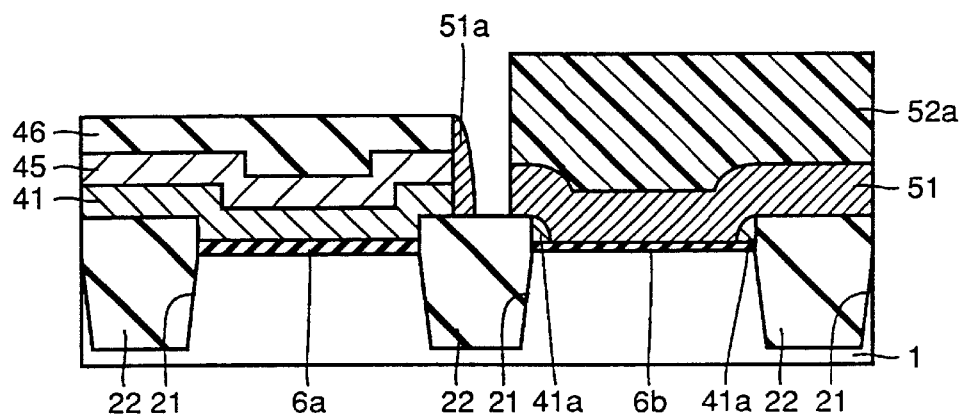

Consequently, when the first and second conductive layers 41 and 45 are patterned using a resist pattern 44e, a residue 41a of the first conductive layer is left at a sidewall of the step resulting from the trench separation structure, as shown in FIG. 52. Furthermore, when a third conductive layer 51 is deposited on the entire surface, as shown in FIG. 53, and is then patterned using a resist pattern 52a, a residue 51a from conductive layer 51 is also left at a sidewall of the first and second conductive layers 41 and 45 and insulation layer 46, as shown in FIG. 54.

Figure 55:
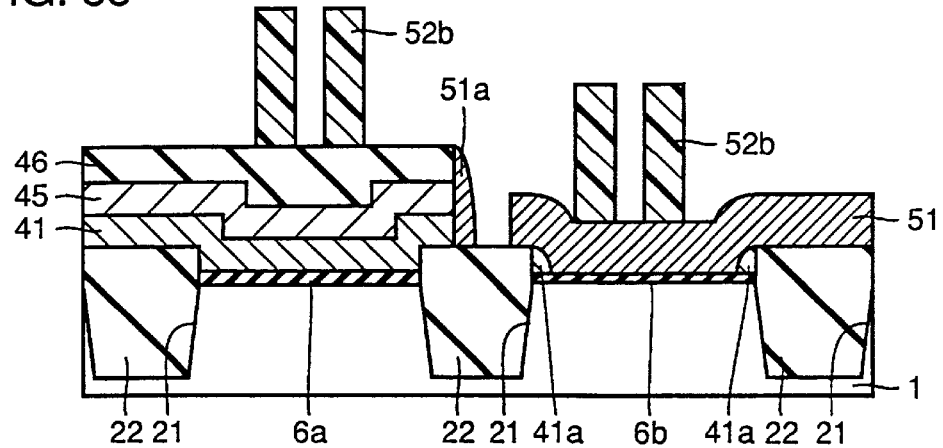
Figure 56:
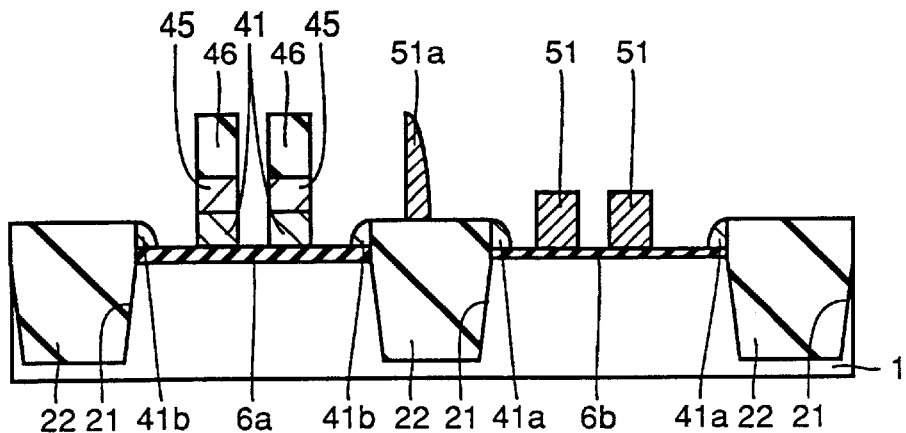
Figure 57:
FIGS. 57–62 are schematic cross sectional views illustrating steps of a method of manufacturing a semiconductor device having a conventional dual gate oxide.
Figure 58:
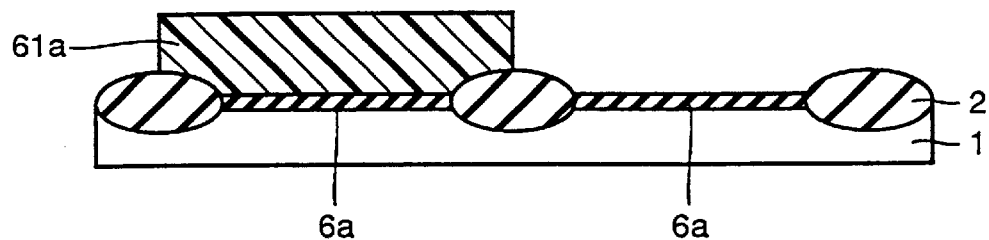
Figure 59:
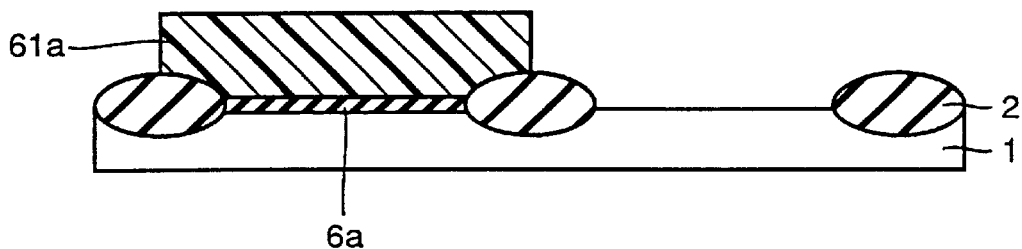
Figure 60:
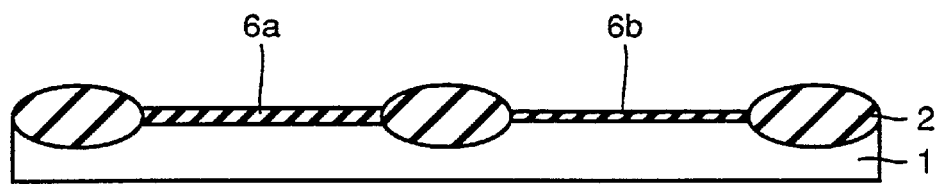
Figure 61:
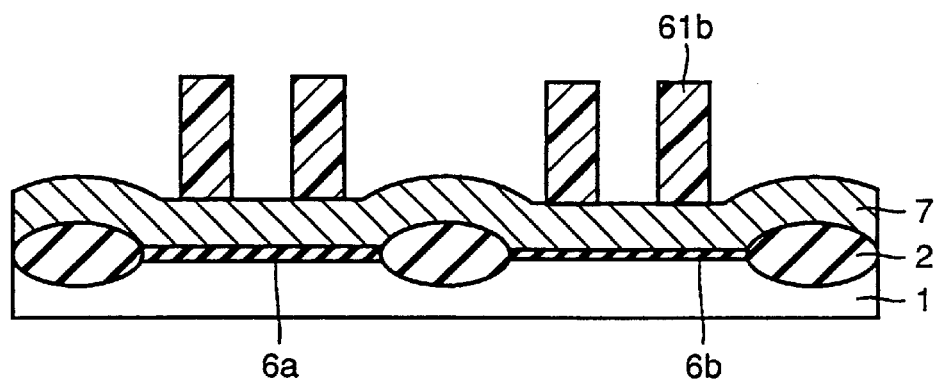
Figure 62:
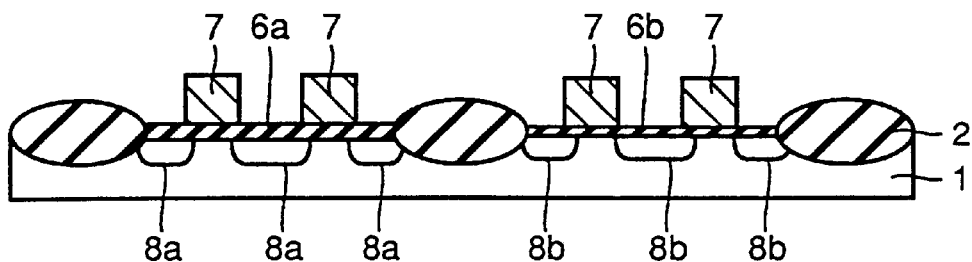
Figure 63:
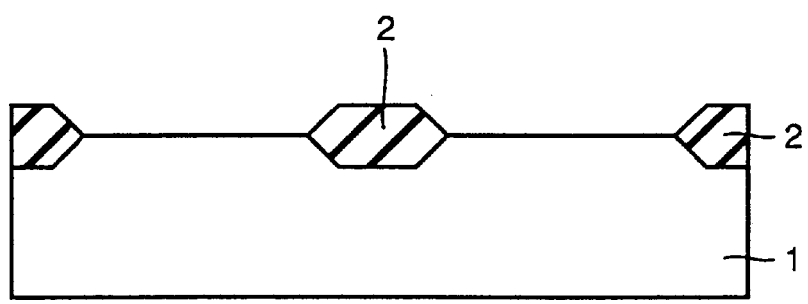
FIGS. 63–65 are schematic cross sectional views illustrating steps of the manufacturing method disclosed in Japanese Patent Laying-Open No. 7-297298.
Figure 64:
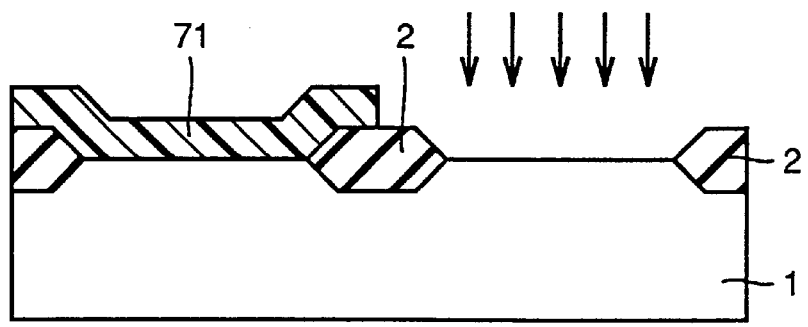
Figure 65:
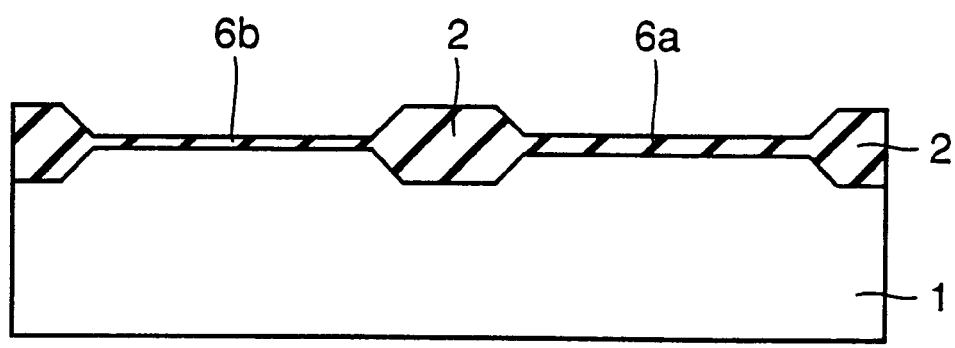

Furthermore, a resist pattern 52b is used as a mask to etch the underlying layers, and shown in FIG. 55, to pattern them into a gate electrode as shown in FIG. 56, a residue 41b of the first conductive layer 41 is left at a sidewall of the step of buried insulation layer 22.

Thus, if a trench separation structure is initially formed and a gate electrode having a multi-layered structure is then formed, a large number of residues 41a, 41b and 51a are left and these residues significantly cause disadvantages, such as short-circuit between other conductive layers.

By contrast, according to the manufacturing method of the present embodiment, the first conductive layer 41 which will serve as a gate electrode layer is first formed and a trench separation structure is then formed. Thus, any residue of the first conductive layer 41 is not left when the first conductive layer 41 is patterned for forming a gate electrode.

Furthermore, since the second conductive layer 45 is formed on a surface having a gentle shape provided through isotropic etching as shown in FIGS. 39 and 40, any residue of the second conductive layer 45 is prevented from producing in patterning the second conductive layer 45.

Thus the manufacturing method according to the present invention can prevent residue production. Thus, other conductive layers are not disadvantageously short-circuited due to residue.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including gate oxide films each having a different thickness, comprising:

a semiconductor substrate having first and second regions at a main surface;

a first gate oxide film formed in contact with the main surface of said semiconductor substrate in said first region;

a second gate oxide film formed in contact with the main surface of said semiconductor substrate in said second region and different in film thickness from said first gate oxide film; and an oxidation rate adjusting substance added only within a depth range of no more than 2 nm from the main surface of said semiconductor substrate in said first region.

2. The semiconductor device according to claim 1, wherein said oxidation rate adjusting substance is an oxidation promoting substance and said first gate oxide film is greater in thickness than said second gate oxide film.

3. The semiconductor device according to claim 2, wherein said oxidation promoting substance is a halogen.

4. The semiconductor device according to claim 1, wherein said oxidation rate adjusting substance is an oxidation restraining substance and said first gate oxide film is thinner than said second gate oxide film.

5. The semiconductor device according to claim 4, wherein said oxidation restraining substance is nitrogen.

* * * * *